US012210870B2

(12) United States Patent
Katrak

(10) Patent No.: US 12,210,870 B2
(45) Date of Patent: Jan. 28, 2025

(54) ENSURING FUNCTIONAL SAFETY REQUIREMENT SATISFACTION USING FAULT-DETECTABLE MICROCONTROLLER IDENTIFIERS

(71) Applicant: Fort Robotics, Inc., Philadelphia, PA (US)

(72) Inventor: Kerfegar Khurshed Katrak, Fenton, MI (US)

(73) Assignee: Fort Robotics, Inc., Philadelphia, PA (US)

( * ) Notice: Subject to any disclaimer, the term of this patent is extended or adjusted under 35 U.S.C. 154(b) by 808 days.

(21) Appl. No.: 17/332,626

(22) Filed: May 27, 2021

(65) Prior Publication Data
US 2022/0382543 A1     Dec. 1, 2022

(51) Int. Cl.
| G06F 9/22 | (2006.01) |
| G05B 9/02 | (2006.01) |
| G05B 19/048 | (2006.01) |
| G05B 23/02 | (2006.01) |
| H03M 13/09 | (2006.01) |
| G06F 7/02 | (2006.01) |

(52) U.S. Cl.
CPC .............. *G06F 9/226* (2013.01); *G05B 9/02* (2013.01); *G05B 19/048* (2013.01); *G05B 23/0235* (2013.01); *H03M 13/09* (2013.01); *G06F 7/02* (2013.01)

(58) Field of Classification Search
CPC .. G06F 9/226; G06F 7/02; G05B 9/02; G05B 19/048; G05B 23/0235; G05B 19/0428; H03M 13/09
See application file for complete search history.

(56) References Cited

U.S. PATENT DOCUMENTS

| 7,046,700 B1 * | 5/2006 | Roberts ................. H04J 3/0605 370/535 |
| 2008/0104674 A1 | 5/2008 | Sherkin et al. |
| 2014/0032970 A1 * | 1/2014 | Hovi ..................... B66B 1/3453 714/37 |

(Continued)

FOREIGN PATENT DOCUMENTS

WO     2014082051 A1     5/2014

OTHER PUBLICATIONS

International Search Report received in PCT/US22/30961 dated Nov. 22, 2022.

*Primary Examiner* — Zhipeng Wang
(74) *Attorney, Agent, or Firm* — Run8 Patent Group, LLC; Peter Miller; Brian T. Chew

(57) ABSTRACT

An application processor receives first and safety state information from first and second microcontrollers, and respective first and second sets of bytes forming a first identifier of the first microcontroller and a second identifier of the second microcontroller. The processor concatenates a safety message including the first and second safety state information, the safety message including the first set of bytes and the second set of bytes. The processor transmits the safety message to a second application processor of a safety controller, which separates, the first set of bytes and the second set of bytes, compares at least one of the first set of bytes and the second set of bytes to a data structure of known microcontroller identifiers, and verifies the safety state information based on identifying a match.

20 Claims, 19 Drawing Sheets

(56) References Cited

U.S. PATENT DOCUMENTS

| | | | |
|---|---|---|---|
| 2015/0045915 A1* | 2/2015 | Schmidt | H04L 67/10 700/79 |
| 2018/0329848 A1* | 11/2018 | Kattainen | B66B 1/3461 |
| 2019/0026103 A1 | 1/2019 | Maas | |
| 2019/0114860 A1* | 4/2019 | Eckelmann-Wendt | H04L 9/3247 |
| 2022/0158983 A1* | 5/2022 | Schmid | H04L 63/062 |

\* cited by examiner

|  | Unasserted | Undefined | Asserted |
|---|---|---|---|
| Unasserted | ▓ |  |  |
| Undefined |  |  |  |
| Asserted |  |  | ▓ |

FIG. 9B

|  | Unasserted | Asserted | Safe |
|---|---|---|---|
| Unasserted |  |  |  |
| Asserted |  | ▓ |  |
| Safe | ▓ |  |  |

1702 — receive, at a device operating in a normal mode, a request to switch to a functional safety mode, the request comprising a selection of a safety actuator and one or more of a plurality of secondary actuators, the safety actuator operably coupled to a first microcontroller, a second microcontroller, and an application processor of the device, the plurality of secondary actuators each operably coupled to the application processor;

1704 — responsive to receiving the request, transmit a first safety message from the safety actuator to the first microcontroller and transmitting a second safety message from the safety actuator to the second microcontroller;

1706 — validate the safety message at the first microcontroller and the second microcontroller, the validation resulting in first validation values from the first microcontroller and second validation values from the second microcontroller;

1708 — validate the first validation values against the second validation values; and 1710 — responsive to successfully validating the safety message at the first microcontroller and the second microcontroller, and successfully validating the first validation values against the second validation values, command the device to transition from the normal mode to the functional safety mode.

FIG. 17

ENSURING FUNCTIONAL SAFETY REQUIREMENT SATISFACTION USING FAULT-DETECTABLE MICROCONTROLLER IDENTIFIERS

TECHNICAL FIELD

This disclosure generally relates to the field of machine control, and more particularly relates to ensuring functional safety compliance when transmitting safety messages between machines in a facility.

BACKGROUND

As society progresses, machines are relied upon to perform myriad activities. Many of these activities are inherently dangerous (e.g., operating heavy machinery). Many of these activities also involve machines operating in the presence of human beings (e.g., warehouse operations, construction zones, etc.). Data communications between machines are subject to noise that may adulterate a message that commands a machine to take a certain activity, or that reflects a state of a machine, thus causing the commands or states read by a receiving machine to be incorrect. In many circumstances, noise, latency, and other issues are tolerated in data communications, where data packets can be prioritized or re-sent to effectively transmit messages. However, where safety is in question, errors in such communications cannot be tolerated, as even a small error could cause loss of human life or catastrophic failure.

Functional safety standards have been established that require machines involved in dangerous activities to meet the standards in transmitting communications, such that errors in communications occur at a rate below an extremely low threshold. Because the threshold is so low, while mechanisms have been developed to meet the functional safety standards, these mechanisms are rigid in nature, requiring inefficient modes of communications, where inefficiencies exacerbate when these mechanisms are scaled for deployment across fleets of machines.

SUMMARY

Systems and methods are disclosed herein that enable efficient communication between machines subject to functional safety requirements, while ensuring adherence to such requirements. Multiple microcontrollers are used in conjunction with application processors of the machines, thus providing scalable redundancies that can be used to compare processing and detect errors occurring during communication. Yet further, encoding is performed on data included in the messages to detect multiple bit overwriting by comparing against expected values for the encoding, thus enabling detection of errors even where the errors may occur across the redundancies. Fault indicators are determined for encoded values as well, offering yet another layer of encoding that reveals bit overwrite errors in communications. Where errors are detected, machines are commanded to enter a safe state, which prevents them from taking action that may cause danger until such a time that the erroneous messages are resolved.

In an embodiment, an application processor receives first and second safety state information from first and second microcontrollers, and respective first and second sets of bytes forming a first identifier of the first microcontroller and a second identifier of the second microcontroller for transmission by a transmitter of a safety module. The application processor generates a safety message by aggregating (e.g., concatenating) the first and second safety state information, the safety message including the first set of bytes and the second set of bytes. The application processor transmits the safety message to a second application processor of a safety controller, which separates the first set of bytes and the second set of bytes. Each microcontroller of the safety controller compares at least one of the first set of bytes and the second set of bytes to a data structure of known microcontroller identifiers, and verifies the safety state information based on identifying a match.

In an embodiment, a safety module having a plurality of microcontrollers receives an analog input and determines a value of the analog input. The microcontrollers each determine a respective ternary state of the device by identifying, from three candidate ranges of values (e.g., a functional range, a safe range, and an error/failure range), a range of values in which the value falls, where at least two of the plurality of microcontrollers uses different candidate ranges of values (e.g., varying voltage values for diversity), and determine, based on the identified range, a ternary state corresponding to the range, and assigning the determined ternary state as the respective ternary state. The safety module determines whether the ternary states from the two microcontrollers map to a fault state (e.g., a state other than a normal or operational state, such as a safe state, or an error/failure state), and, where they do, cause a command a command to be output to the device to enter a safe state.

In an embodiment, a microcontroller receives, from a device, an input signal having a value. The microcontroller generates an adjusted value by adjusting the value to an adjusted value within a range of tolerance of a state determination system, and determines a first range of the adjusted value, the first range being within one of an asserted (e.g., safe) range, an unasserted (e.g., normal) range, or a fault range. Each microcontroller compares the first range to a second range, the second range derived based on one or more of a different input signal or a different microcontroller, and determines a result of the comparison, the result being an asserted state where the first range and the second range both are within an asserted range, the result being an unasserted state where both ranges are within an unasserted range, and the result otherwise being a fault state, and outputs the result to an output controller.

In an embodiment, an output controller receives a pair of safety state inputs, and, at each of a first microcontroller and a second microcontroller determines whether the pair of safety state inputs both show an unasserted state. Responsive to determining that the pair of safety state inputs both show an unasserted state, the output controller determines a normal state (e.g., a functional state, or a state where output relating to the determination is disabled), and otherwise the output controller determines a safe state. The output controller outputs a binary software command reflecting either a normal state or an enabled state (safe state), and converts the binary software command to a hardware command that maintains the state of voltage of a circuit where the binary software command reflects a normal state and otherwise switches to a safe state. Each microcontroller of the output controller compares readback output values from the two microcontrollers (e.g., based on output waveform or state), and generates an output therefrom (e.g., failing over to a safe state where the comparison does not match).

In an embodiment, a device operating in a normal mode receives a request to switch to a safety mode, the request including a selection of a safety actuator and one or more of a plurality of secondary actuators. Responsive to receiving the request, the device transmits a safety message from the safety actuator to a first microcontroller, and transmits a safety message to a second microcontroller. The each of the first microcontroller and the second microcontroller validate their respective safety messages, the validation resulting in first validation values from the first microcontroller and second validation values from the second microcontroller. The each microcontroller compares the first validation values against the second validation values, and, validates the messages by determining whether the comparison yields a match. Responsive to successfully validating the safety message at the first microcontroller and the second microcontroller, and successfully validating the first validation values against the second validation values, the device commands a transition from the normal mode to the functional safety mode.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

FIG. 3 illustrates one embodiment of a data structure showing a concatenated safety message for input information.

FIG. 4 illustrates one embodiment of a data structure showing a concatenated safety output.

FIG. 9B shows an illustrative table representing normal states, safety states, and fault states.

FIG. 10B shows an illustrative table representing normal states, safety states, and fault states.

Figure 12:
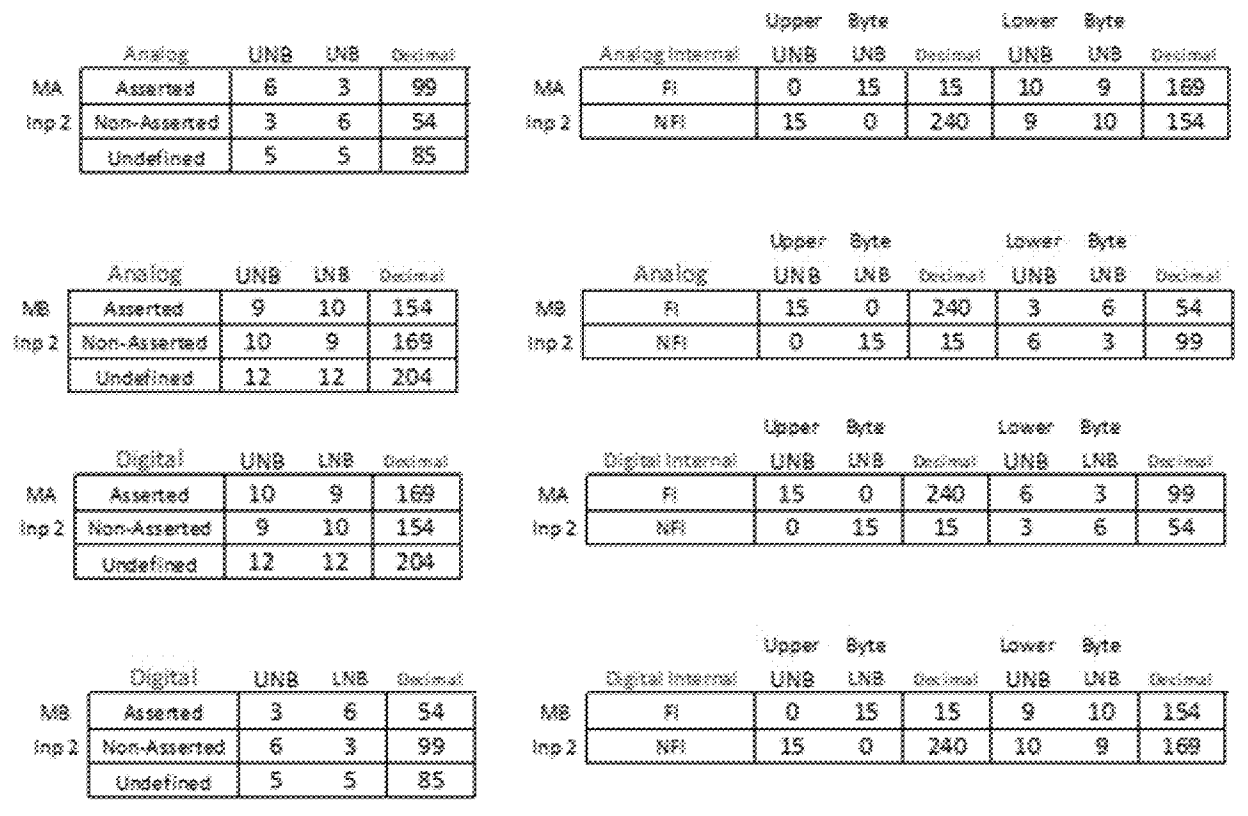

FIG. 12 illustrates one embodiment of encoded safety messages and fault indicators derived therefrom.

FIG. 17 illustrates one embodiment of an exemplary process for operating a remote controller to initiate functional safety activities, in accordance with an embodiment.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Exemplary Facility Overview

Figure 1:
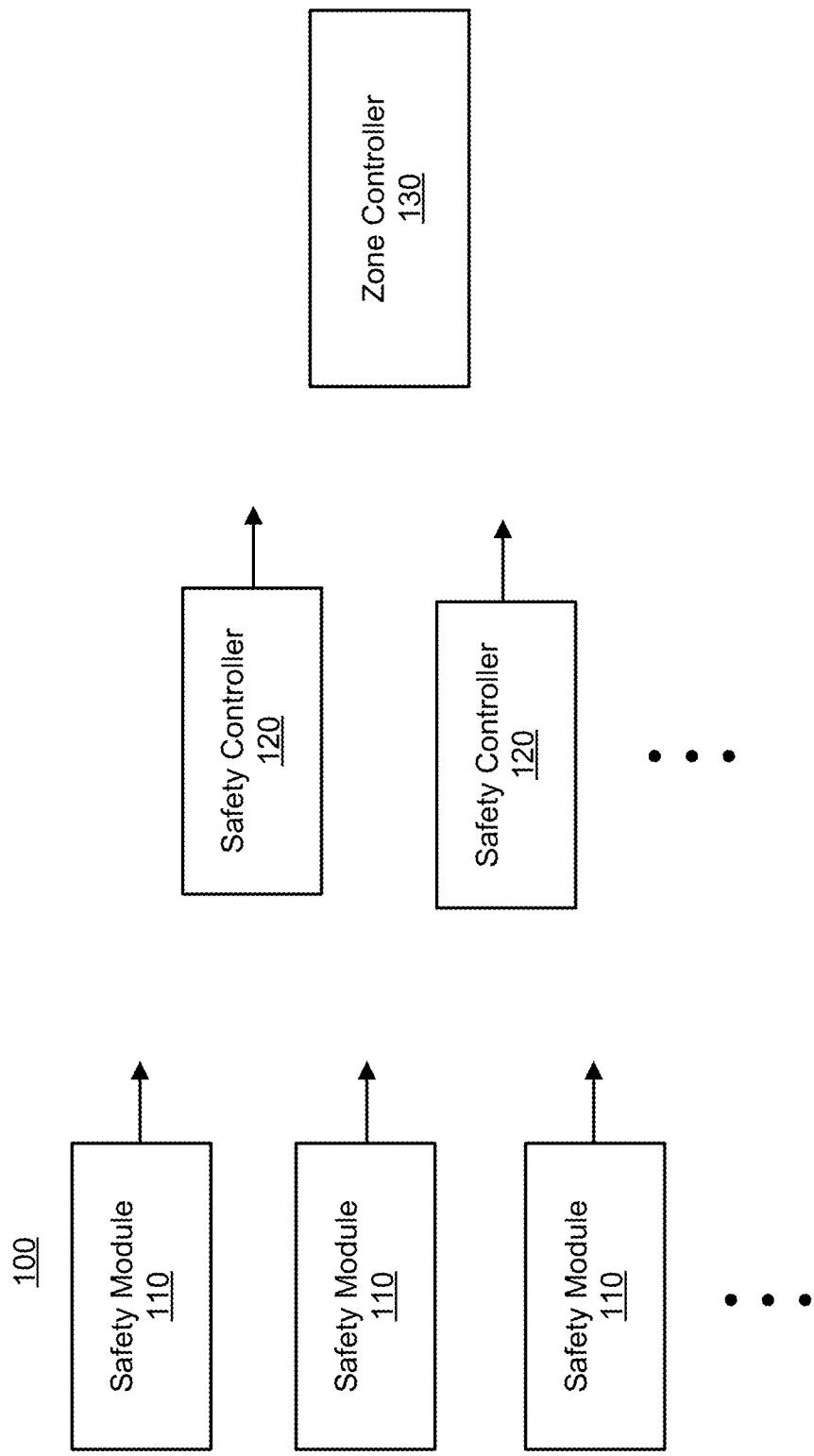
FIG. 1 illustrates one embodiment of an exemplary setup of cascading input machines in a facility.

FIG. 1 illustrates one embodiment of an exemplary setup of cascading input machines in a facility. As depicted in FIG. 1, facility 100 includes safety modules 110, safety controller 120, and zone controller 130. The term facility, as used herein, may refer to a logical grouping of machines. A facility may be a physical space, such as a warehouse, processing area, plant, or other physical space where machines are operated. A facility need not be a defined physical space, so long as there is a logical association between machines that are operable to communicate with other machines in the facility.

Safety modules 110 are communications modules that transmit safety input messages (interchangeably used with "safety input messages" throughout the disclosure) and receive safety messages. One or more safety modules 110 may be implemented within a given machine. The safety modules 110 may be integrated with other logic for transmitting and receiving other information in addition to safety messages. Safety messages are messages that indicate a state (e.g., safe, enabled, or safe state due to faults) of a machine (or a module or sub-component thereof; where the term "machine" is used, this is done for simplicity, and a module or sub-component of the machine is equally implied), and are used to dictate whether the machine should enter a safe state (e.g., be disabled where either safe state is encountered, or a fault is detected). Further details of safety messages are discussed below with respect to FIGS. 4-5. Safety modules 110 may communicate with one another, and/or may communicate with safety controllers 120.

Safety controllers 120 are safety modules that are configured to receive and transmit safety messages to/from safety modules 110. In some embodiments, safety controllers 120 may be configured to transmit safety messages to two or more safety modules 110. For example, a safety controller 120 may be configured to, upon occurrence of a condition (e.g., a given machine has entered a safe state; a given command is received that affects multiple machines), command predefined segments of other machines to change state (e.g., also enter a safe state). Zone controller 130 operates similarly to safety controllers 120, except in addition to being configured to transmit safety messages to safety modules 120, zone controller 130 may additionally or alternatively transmit safety messages to one or more safety controllers 120 (and receive messages therefrom). Zone controllers 130 are termed as such because they may be used to transmit safety messages across a "zone," which may be a logical sub-grouping of machines in a facility. The illustration in FIG. 1 is exemplary, and may cascade to any number of tiers where, e.g., zone groupings may interact with yet another controller, and/or a facility controller may be configured to transmit safety messages to all machines of an entire facility (e.g., an emergency facility-wide shutdown). Mapping tables or other logical associations may be used, where conditions, types of commands or states, or other triggers may be mapped to downstream machines and controllers that should receive commands when a condition is met.

Safety Message Generation and Contents

Figure 2:
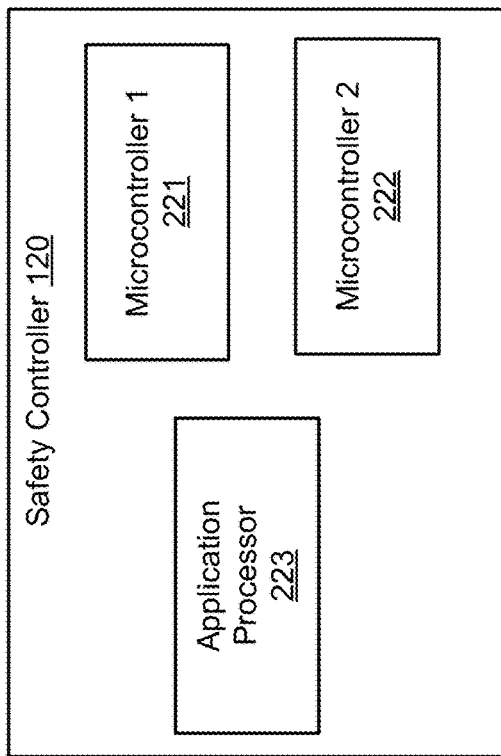
FIG. 2 illustrates one embodiment of exemplary multi-microcontroller and application processor setups of each controller that is transmitting or receiving communications.
Figure 2:
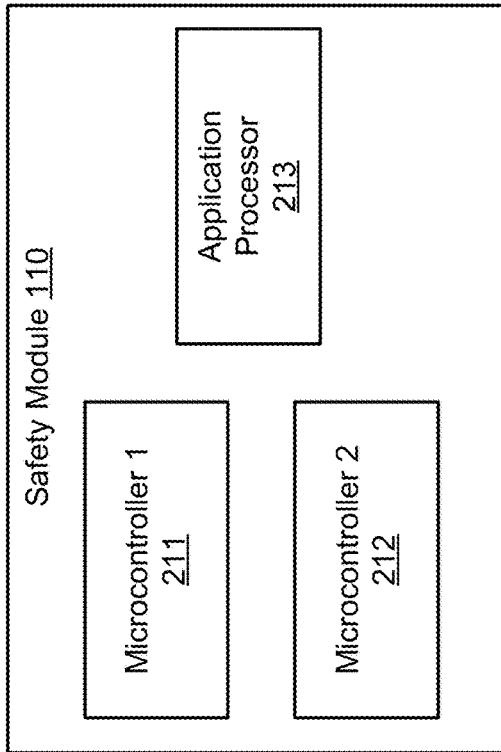

FIG. 2 illustrates one embodiment of exemplary multi-microcontroller and application processor setups of each controller that is transmitting or receiving communications. As depicted in FIG. 2, safety module 110 includes microcontrollers 211 and 212, and application processor 213. The term microcontroller is used interchangeably with "microprocessor" herein. Safety controller 120 similarly includes microcontrollers 221 and 222, and application processor 223. Communications through the application processors by the microcontrollers may be set up in a black channel setup where the application processors simply concatenate/separate information passed between the underlying microcontrollers without otherwise analyzing or manipulating that data. The multi-microcontroller and application processor setup may be extended to any module and/or controller depicted or described with reference to FIG. 1, and may also be implemented in any device interacting with a machine of a facility (e.g., a remote control device for interfacing humans with machines). Using two or more microcontrollers to communicate safety state information ensures that functional safety requirements are met (that is, ensuring the probability of an error in a message is below a threshold maximum error value) when communicating between machines, even in noisy mediums like wireless communications and high-utilization wired communications.

In brief, each microcontroller 211 and 212 generates a safety message based on an input to the machine in which it sits (e.g., a user presses an emergency stop button). The safety information indicates a safety state (e.g., a state indicating whether a safety mode should be engaged or not, where not doing so allows for normal operation to continue or for a new command to be issued). The message is passed through a transmission medium (e.g., a network communications link like the Internet, WiFi, Bluetooth, or any other communications channel) to a receiving device (e.g., safety controller 120), where each microcontroller of the receiving device (e.g., microcontrollers 221 and 222) decode the message. Where the microcontrollers agree on the safety state, the safety state is determined to be true (e.g., by application processor 223). Otherwise, the machine is commanded to enter a safe state (e.g., to stop performing a given task; cut off a fuel supply; shut down; etc.) to ensure that an unsafe activity is not performed until the safety state can be reconciled. Further description of how to use two microcontrollers to meet this threshold is further described in commonly-owned U.S. patent application Ser. No. 17/192,657, filed Mar. 4, 2021, the disclosure of which is hereby incorporated by reference herein in its entirety.

Figure 3:
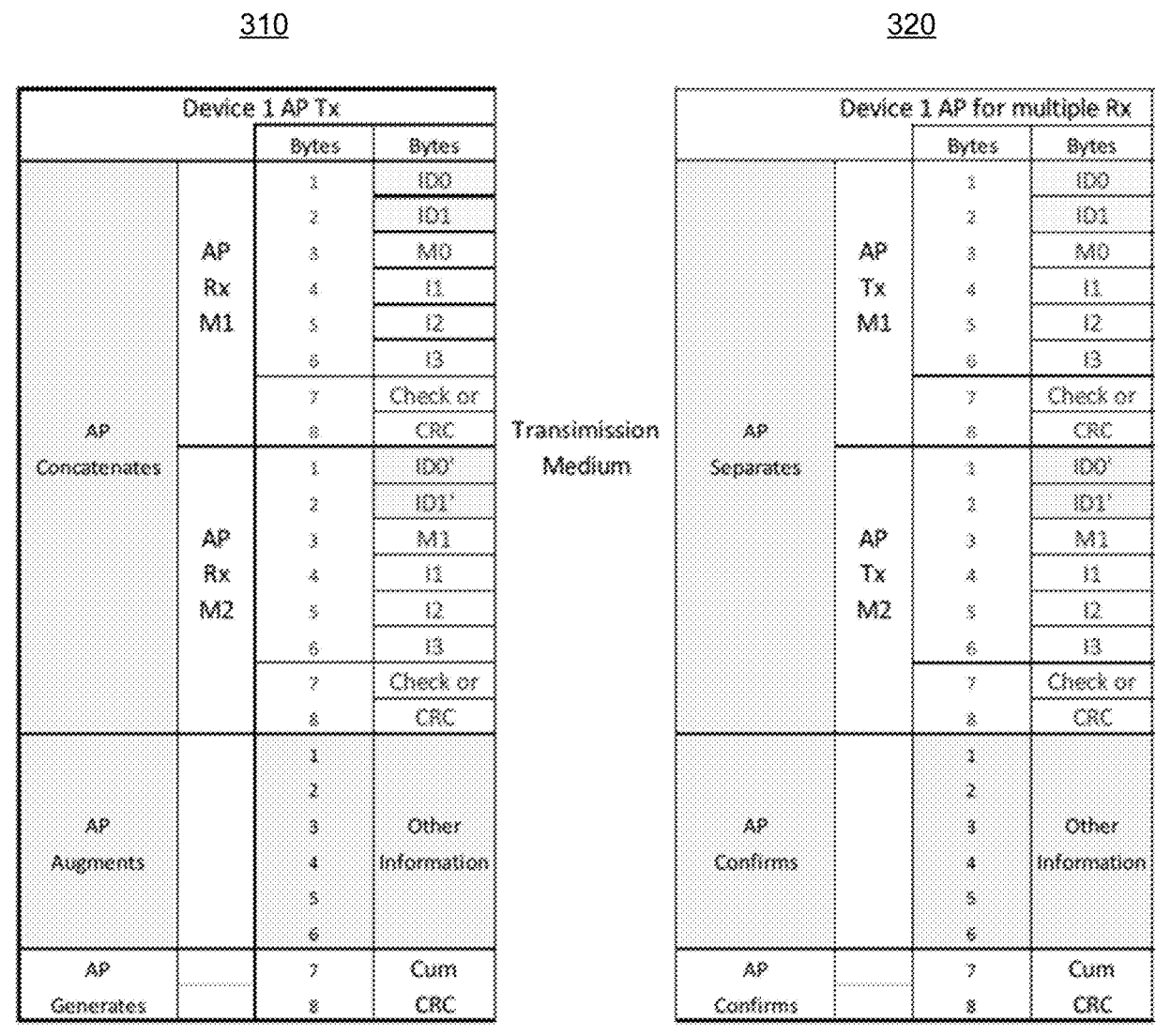

FIG. 3 illustrates one embodiment of a data structure showing a concatenated safety message for input information. FIG. 3 depicts a data structure of a safety message 310 as concatenated by an application processor (e.g., application processor 213), which is transmitted over a transmission medium (e.g., any network, such as the Internet, WiFi, Bluetooth, LTE, or any other network) to a receiving device (e.g., safety controller 120), whose application processor (e.g., application processor 223) processes the message. As depicted in safety message 310, the application processor concatenates information from each microcontroller, where "AP Rx M1" is referring to information the application processor received from one of the two microcontrollers (e.g., microcontroller 211), and "AP Rx M2" is referring to information the application processor received from the other of the two microcontrollers (e.g., microcontroller 212). Where more than two microcontrollers are used, the application processor may concatenate information from those further microcontrollers into the safety message.

The first two bytes of the safety message ("ID0," "ID1") include bytes that, together, uniquely identify the microcontroller. The unique identifiers, and processes that ensure that the identifiers are unique and verifiable in a way that ensures adherence to functional safety requirements, are described in further detail below with reference to FIGS. 5-6. The third byte of the safety message ("M0") refers to a state of the first microcontroller (e.g., functional or failed). A functional state indicates a normal state. A failed state occurs when any safety mechanism has failed, and a functional state occurs where all safety mechanisms have no faults The fourth through sixth bytes ("I1", "I2", "I3") refer to one or more inputs received by the microcontroller (e.g., emergency stop input or any other input). The order of bytes depicted is merely exemplary; any order may be used. Similar concatenation is done for the second microcontroller, where the second microcontroller has its own unique identifier ("I0'," "I1'") and its own M1, but shows the same inputs received at the machine on which the two microcontrollers are both installed. The application processor concatenates the information from both processors, as well as an error code (e.g., cyclic redundancy check (CRC) code). Further information about appending one or more error codes to safety data of two or more microcontrollers and decode/verify safety messages using the same is also described with reference to commonly-owned U.S. patent application Ser. No. 17/192, 657, filed Mar. 4, 2021, the disclosure of which is hereby incorporated by reference herein in its entirety. The application processor may augment the data of the microcontrollers with other information, and may generate a cumulative error code (e.g., cumulative CRC) for the message in its entirety.

The application processor of the input device transmits the safety message, after it is concatenated, to the receiving device (e.g., safety controller 120), which decodes the message. On the receiving side 320, the application processor (e.g., of safety controller 120) separates the messages from each microcontroller. Where M0 or M1 indicate a fault state, all of inputs I1-I3 are failed. Systems and methods for decoding the message while ensuring functional safety standards are described with reference to commonly-owned U.S. patent application Ser. No. 17/192,657, filed Mar. 4, 2021, the disclosure of which is hereby incorporated by reference herein in its entirety. Further disclosure on further ensuring the meeting of functional safety standards by verifying the identifiers of the microcontrollers is described in further detail with reference to FIGS. 5-6 below. Further discussion of processing input signals is described with reference to FIGS. 6-9 below.

Figure 4:
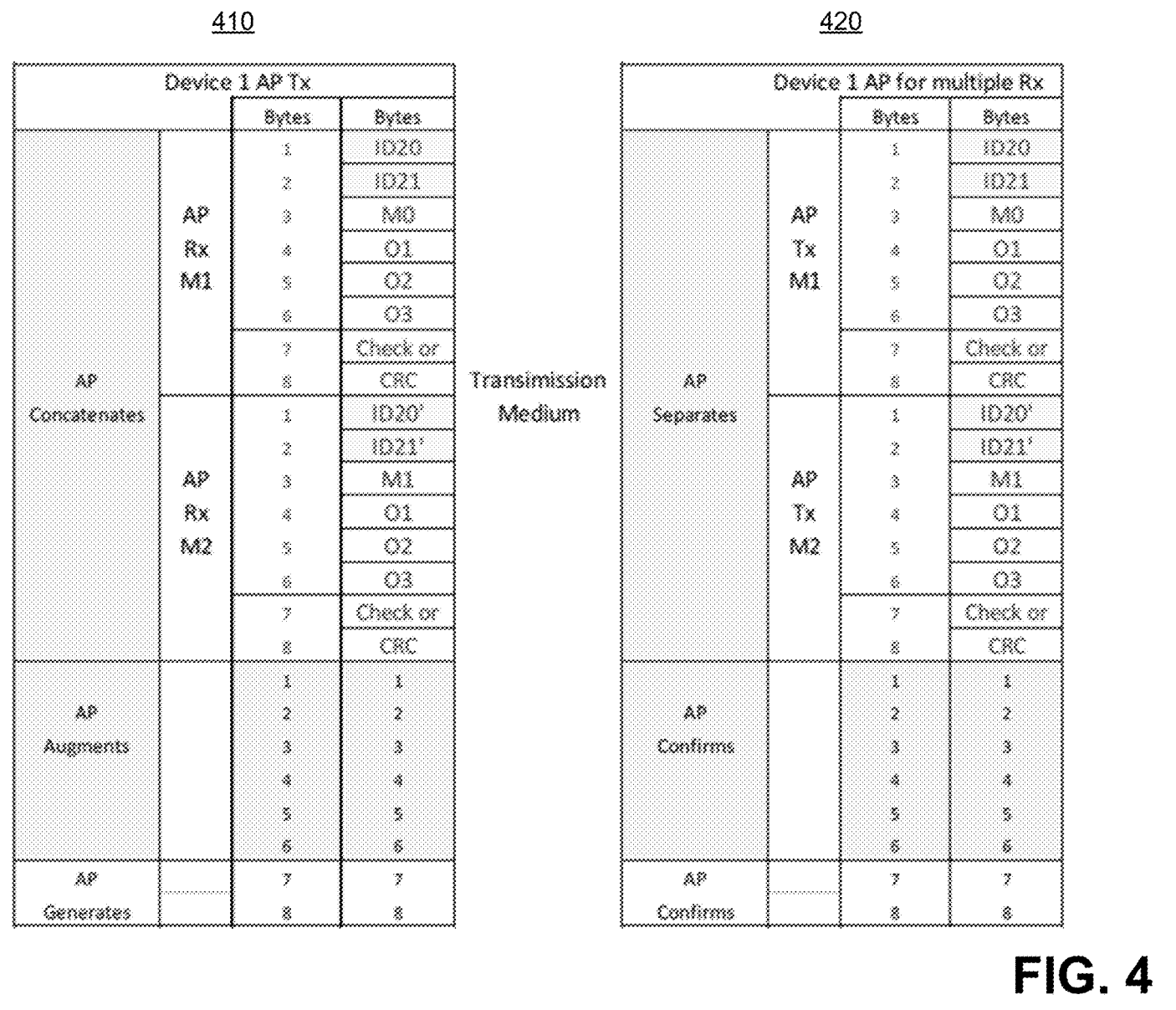
Figure 5:
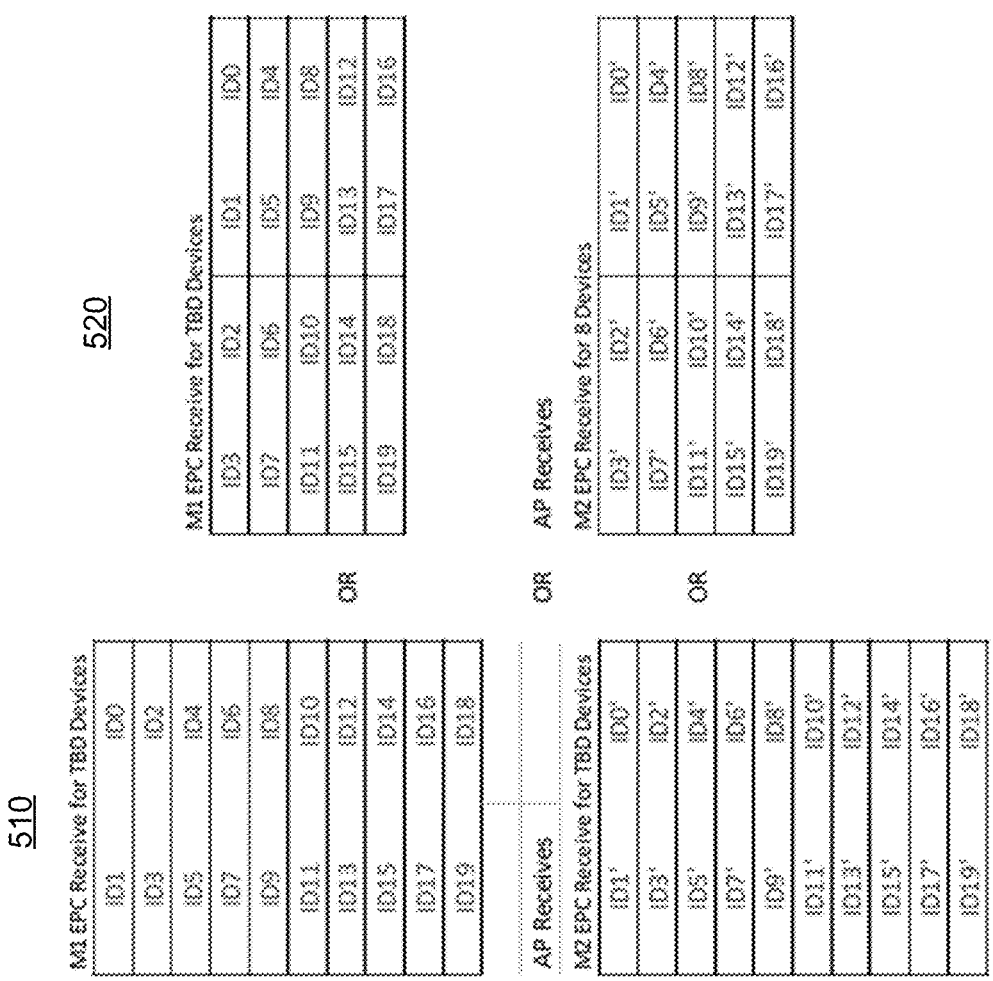
FIG. 5 illustrates one embodiment of exemplary data structures used to verify identifiers within a given microcontroller.

FIG. 4 illustrates one embodiment of a data structure showing a concatenated safety output. The term output information, as used herein, may refer to a command (e.g., made by a controller such as safety controller 120, zone controller 130, a facility controller, etc.) to one or more machines, the command relating to a safety operation. Safety messages 410 and 420, as depicted in FIG. 4, are constructed similarly to the safety messages of FIG. 3, except that the microcontroller IDs ("ID20", "ID21", "ID20'", "ID21'") correspond to the microcontroller IDs of the controller, and that bytes 4-6 show outputs O1, O2, and O3 (as opposed to inputs I1, I2, and I3). The outputs may indicate a command to the machine to revert to a given state (e.g., go to a safety mode, which may translate to cutting power or disabling a mechanism associated with the safety communication). As indicated in FIG. 5, the outputs may go to any number of machines to which the controller is operably coupled. Further discussion of processing output signals is further described with reference to FIG. 10 below.

Fault-Detectable Microcontroller Identifiers

When safety messages are transmitted, as mentioned before, functional safety requirements must be met. That is, where errors are possible, those errors must be extremely detectable, where a chance of undetectable error is lower than an extremely low threshold. In order to comply with such a threshold while enabling the disclosed system to function, an encoding scheme is used for the microcontroller identifiers to ensure detectability of errors based on unexpected microcontroller identifiers being encountered. In an embodiment, the system is architected such that where errors occur, they are single or multiple bit-line errors (where used throughout this disclosure, the term "bit-line error" may refer to single or multiple bit-line errors whether used in the singular or plural). A bit-line error is an error where bit values in a byte of information always fail in a same direction (e.g., having a same polarity of 1 or 0) via bit overwriting. In some embodiments disclosed herein, bit-line errors are detectable in random access memory (RAM), flash memory, read only memory (ROM), in transfer from flash memory to RAM, and so on.

Microcontroller identifiers (IDs) may be encoded in a manner such that, where a bit-line error occurs, a microcontroller ID would fail to a value that is unexpected, thus ensuring that the bit-line error is detectable. The encoding is independent of any underlying memory structure, such as where logical and physical memory addresses are the same, bit multiplexed, or have other configurations. The encoding may occur in flash memory, RAM, transfer from flash to RAM, and so on.

To perform the encoding, word identifiers are assigned for each microcontroller according to rules, the word identifiers each having two bytes of IDs that, together, uniquely identify the microcontroller. For example, the identifier of microcontroller 1 shown in FIG. 3 is ID0 and ID1 taken together, which together form a word. The value of each ID (a 4-bit value) is selected from a set of decimal values having a hamming distance greater than or equal to 2. Exemplary such sets may include an "even hamming set," including values of 0, 3, 5, 6, 9, 10, 12, and 15. This is called an "even hamming set" because the number of 0s and 1s bits are even in all candidate values (e.g., 0000=0; 0011=3; 0101=5; etc.). Another exemplary set may include an "odd hamming set," including values of 1, 2, 4, 7, 8, 11, 13, and 14 (e.g., 0001=1; 0010=2; 0100=4; etc.), named because the number of 0s and 1s in each candidate value is odd.

Word identifiers for each microcontroller may be selected using values from a same set, from different sets, or a combination thereof. In an embodiment, word values for a first set of candidate values (for microcontroller M1) are selected in a manner that ensures a hamming distance of 4 for words with odd hamming values for both bytes, or for even hamming values for both bytes. Word values for a second set of candidate values (for microcontroller M2) may then be selected by taking a ones complement for each identifier from the first set of candidate values. This ensures a hamming distance of 8 between the two different sets of candidate values. By deriving encoded identifiers in this manner, where bit-line errors occur during data transmission, the bit-line errors are detected, as they will not match any encoded candidate value. This may similarly be performed by using an odd hamming value for one of the bytes and an even hamming value for the other of the bytes, and taking a ones complement of that set to derive a second set of candidate values, resulting in the same property of detectability.

FIG. 5 illustrates one embodiment of exemplary data structures used to verify identifiers within a given microcontroller. The data structures show different encodings 510 and 520 for word identifiers from multiple microcontrollers (e.g., of a safety module or controller). The microcontroller identifiers may be stored in word format, shown in data structures 510, or double-word format, shown in data structures 520. When an application processor receives a safety message, the application processor extracts the identifier bytes (e.g., the first two bytes shown in FIG. 3), forms them into a word, and compares them against words in data structure 510 and/or data structure 520 to determine whether there is a match. A match will occur absent a bit-line error. Responsive to detecting a bit-line error, the application processor detects that there is a problem, and commands the device from where the inputs were detected to enter a safety mode. The pair-wise identifiers are used to, in multiple microcontrollers (e.g., of a safety module or controller), verify the accuracy of the message in a manner that ensures compliance with functional safety standards based on the aforementioned encodings, in a manner that single-byte identifiers are unable to yield. In an embodiment, the identifiers are stored as upper bytes.

Figure 6:
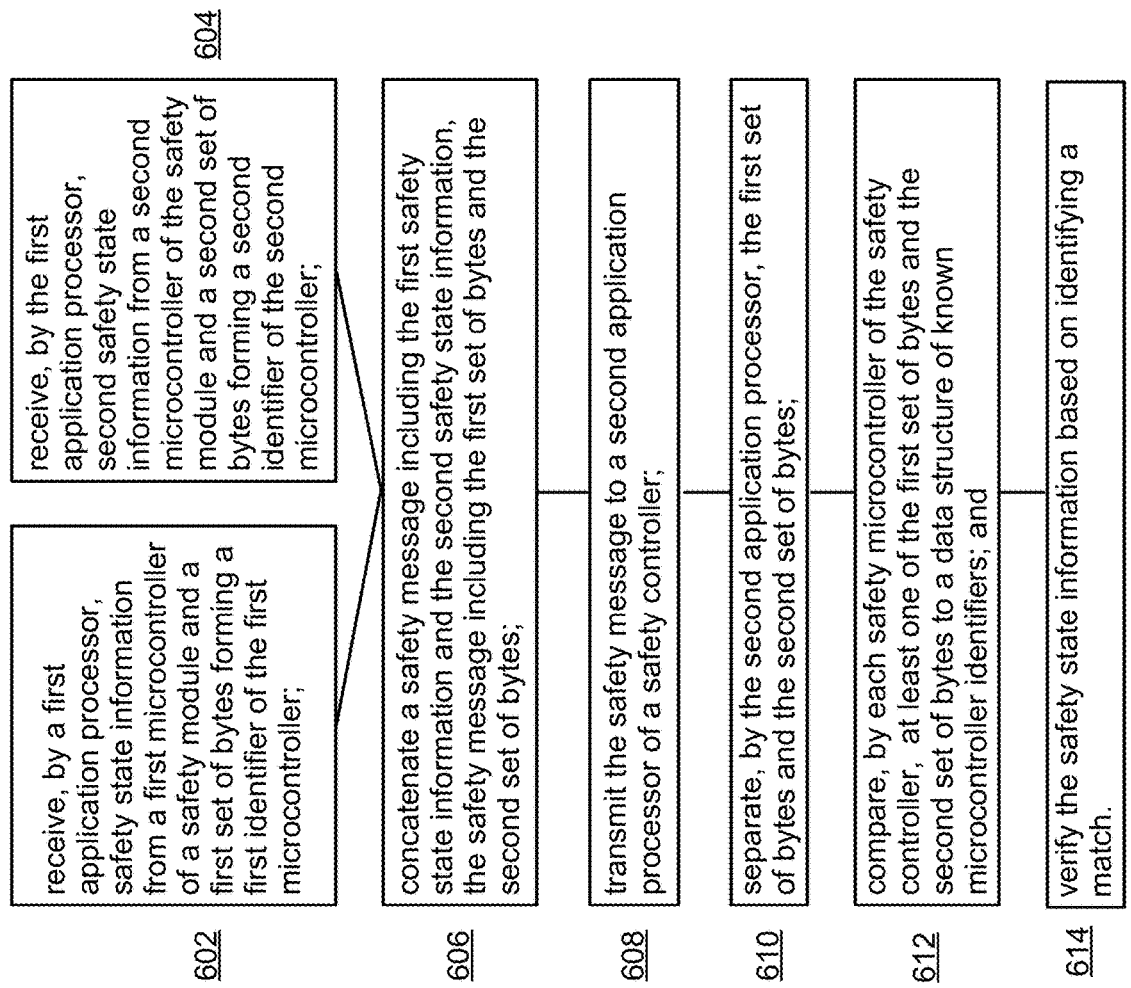
FIG. 6 illustrates an exemplary process of an embodiment for verifying safety state information based on microcontroller identifiers, in accordance with an embodiment.

FIG. 6 illustrates an exemplary process of an embodiment for verifying safety state information based on microcontroller identifiers, in accordance with an embodiment. Process 600 begins with a first application processor (e.g., application processor 213 of safety module 210) receiving 602 safety state information from a first microcontroller (e.g., microcontroller 211) of a safety module (e.g., safety module 110), as well as a first set of bytes forming a first identifier of the first microcontroller (e.g., ID0 and ID1, depicted in safety message 310). The first application processor also receives 604 safety state information from a second microcontroller (e.g., microcontroller 212) of the safety module and a second set of bytes forming a second identifier of the second microcontroller (e.g., ID0' and ID1' of microcontroller 212, shown in safety message 310).

The first application processor concatenates 606 a safety message (e.g., safety message 310) including the first safety state information and the second safety state information, the safety message including the first set of bytes and the second set of bytes. The first application processor transmits 608 the safety message (e.g., using the transmission medium between safety messages 310 and 320) to a second application processor of a safety controller (e.g., application processor 223 of safety controller 120). The second application processor separates 610 the first set of bytes and the second sets of bytes. Each safety microcontroller of the safety controller compares 612 at least one of the first set of bytes and the second set of bytes to a data structure of known microcontroller identifiers (e.g., any data structure depicted in FIG. 5), and verifies 614 the safety state information based on identifying a match.

In some embodiments, verifying the safety state information comprises comparing (e.g., in RAM) the first and/or second set of bytes to encoded values derived by retrieving (e.g., from flash to RAM) encoded sets (e.g., using even and/or odd hamming values) in the manner described in the foregoing. The known microcontroller identifiers from the encoded data reflected in the data structures of FIG. 5 may all be unique to one another. In an embodiment, a logical memory address bit arrangement for either the first or second identifier may be different from their physical memory address bit arrangements.

Transmitting Input Information from Safety Modules to Higher-Level Controllers

Figure 7:
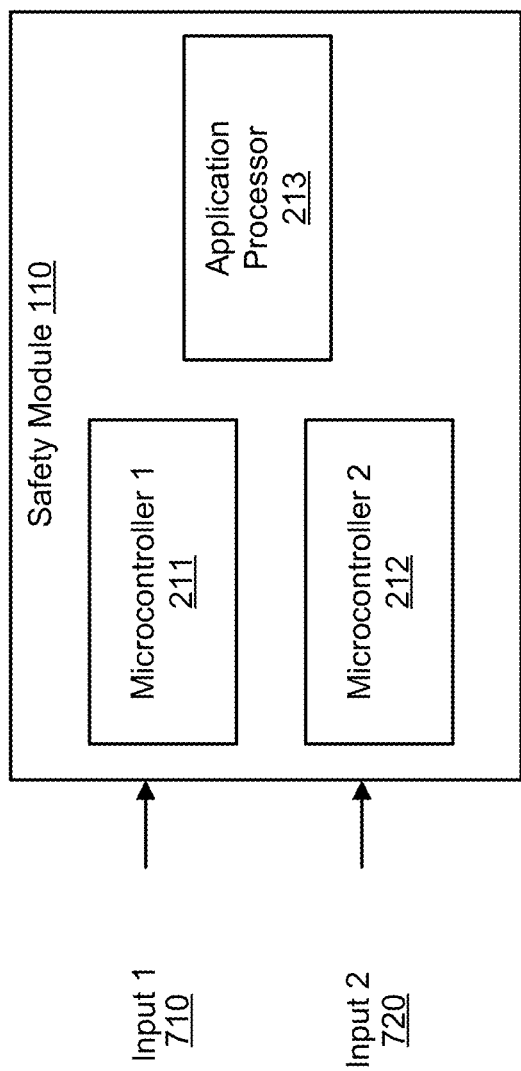
FIG. 7 illustrates one embodiment of inputs read by a safety module.

FIG. 7 illustrates one embodiment of inputs received by a safety module. As depicted in FIG. 7, safety module 110 may receive multiple inputs 710 and 720. While two inputs are depicted, this is merely exemplary, and safety module 110 may receive three or more inputs. The inputs are signals that may impact a safety state of a machine in which safety module 110 sits. For example, the inputs may be from any number of sensors, such as hardware actuators like emergency stop buttons, optical sensors, and the like. Inputs from multiple sensors may be received at a same time, or within a time window in which both inputs are processed. The inputs depicted in FIG. 7 map to input information of safety message 310, in that the data of I1 and I2 of that safety message corresponds to data processed from those inputs by each of the two microcontrollers of safety module 110.

Figure 8:
FIG. 8 illustrates one embodiment of translating analog input into a ternary state.

FIG. 8 illustrates one embodiment of translating analog input into a ternary state. The inputs (e.g., of input 710 and 720) are analog in nature (e.g., having continuous or non-discrete values, or having more than three possible states). For example, the input may be voltage or current (e.g., analog voltage, digital voltage, frequency, pulse width modulation, etc.). The application processor of the safety module converts the analog input into ternary state data. Generally speaking, conversion occurs depending on which of three ranges the value of the analog input fits, the ranges being defined by an administrator as including asserted (e.g., safe and valid) state 810, unasserted (e.g., normal and valid) state 820, and undefined (e.g., safe state due to a diagnostic failure indicator being encountered following diagnosis) state 830. When in asserted state 810, a machine is to take an activity associated with the state. In an embodiment, when in an unasserted state 820, the machine is to continue with normal activity. When in an undefined state 830, logic may apply to command the machine to take an action to ensure compliance with functional safety standards. However, asserted, unasserted, and undefined states may be customized through programmable logic to correspond to any desired activity. More specific manners of converting analog values to ternary states are described in further detail below with reference to, e.g., FIGS. 9-11.

FIG. 9 illustrates one embodiment of converting analog input into a ternary state in a vehicle environment having a wide undefined range. The vehicle environment is merely exemplary; any machine may be used in place of a vehicle. A same safety module is depicted twice in FIG. 9 for convenience, the first depiction showing a receipt of input 610, and the second depiction showing a receipt of input 620, where both inputs are received by the same safety module. These inputs may be received within a same boundary of time, or at different times. As inputs are received, they are optionally first processed by clamp 910. Clamp 910 adjusts one or more values associated with the received input into a tolerable range (e.g., a range for each microcontrollers' ADC inputs). For example, a signal with a high voltage may be received, and the voltage may be adjusted downward by a factor to put it within a range of tolerance of the circuit for determining a logic associated with the signal. The value, as depicted in FIG. 9, is voltage, but may be any other value (e.g., analog voltage, digital voltage, frequency, pulse width modulation, etc.).

After the signal is received (and optionally clamped), the signal runs through circuit 960, which may be configured with a plurality of resistors and a converter (e.g., an analog to digital (ADC) converter). Digital, as used in this context, refers to discrete values, rather than continuous values, such as selection of one of three candidate ternary values. The converter converts to ternary states based on ternary state logic 930 and 940 relative to conditions 920. A hardware abstraction layer (HAL) may be used to convert the analog input into ternary values corresponding to the ternary states. As depicted, vehicle voltage is classified as asserted where voltage is higher than 4V, unasserted where voltage is lower than 1V, and undefined where voltage is between 1V and 4V. Where inputs are of an "active high" type, meaning the stated outcome of reverting to a safety mode should occur when voltage is high, the asserted state corresponds to a safe state (that is, the machine should enter a safety mode), the unasserted state corresponds to a normal state (that is, the machine should continue normal operation where low voltage is detected), and the undefined stat (e.g., safe state where a diagnostic failure indicator is determined after maturation of a diagnostic process) e is to be used based on other logic, to be described in further detail below. Where inputs are of an "active low" type, meaning that the stated outcome of reverting to a safety mode should occur when voltage is low, the opposite happens, where the asserted state corresponds to a normal state, the unasserted state corresponds to a safe state, and the undefined state occurs on a same basis.

In an embodiment, in order to perform the conversion, a HAL of the microcontroller takes the received analog value of the input signal and sends it to the application layer. The application layer determines whether the analog value is below (or optionally below or equal to) a lower bound of analog counts, or above (and optionally above or equal to) an upper bound of analog counts, or between the upper and lower bounds of analog counts. The upper and lower bounds, depicted in FIG. 9, are the voltage limits that define whether a signal is asserted, unasserted, or undefined, though this is exemplary and the counts can be defined in any manner for any parameter. When the ternary state is determined, encoded values are selected that correspond to the asserted/unasserted/undefined state. The encoded values, similar to the process described above with respect to the microcontroller identifiers, are encoded in such a manner that bit-line errors are detectable, based on a hamming distance of at least 4 being maintained between the values.

Each microcontroller of the safety module separately processes inputs and assigns ternary states. This redundancy allows for detection of errors that satisfy functional safety standards. After determinations are made by each of the two microcontrollers, the application processor of the safety module determines a state that the machine should take based on data from the two microcontrollers. Possible states include normal states (e.g., machine continues doing what it is doing), safety states (the machine should enter a safety mode), and fault states (states where error is determined or assumed, in which case, to comply with functional safety standards, the machine by default is to enter a safe state until the true state of normal or safe can be determined; e.g., should the two microcontrollers of a safety module yield different ternary states, then an error is assumed, and a determination is made that a safe state should be entered). States may additionally be determined by performing comparisons of results across different inputs.

Figure 9A:
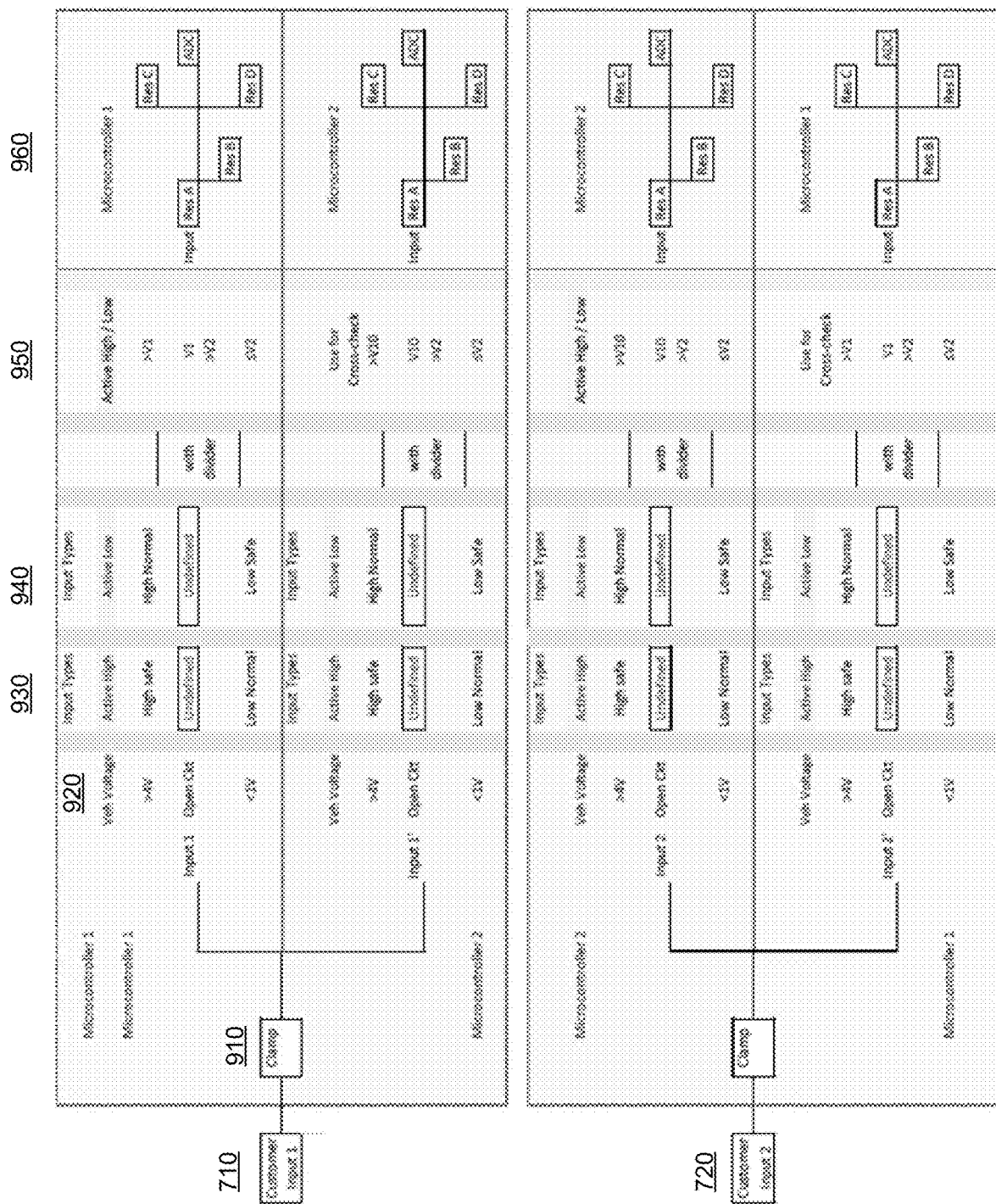
FIG. 9A illustrates one embodiment of converting analog input into a ternary state in a vehicle environment having one or more wide undefined ranges.

FIG. 9B shows an illustrative table representing normal states, safety states, and fault states. FIG. 9B corresponds to FIG. 9A, in either a scenario where high=asserted and low=unasserted, or high=unasserted and low=asserted. The X-axis represents a determined state by microcontroller 1, and the Y-axis represents a determined state by microcontroller 2. As depicted in FIG. 9B, shaded cells indicate a normal state, and unshaded cells indicate a non-normal state. That is, where both microcontrollers determine an unasserted or asserted state, a normal state is determined. In all other scenarios, either a safe state is determined, or a fault state is determined, either of which result in the same outcome—that is, a safety state is entered.

Figure 10A:
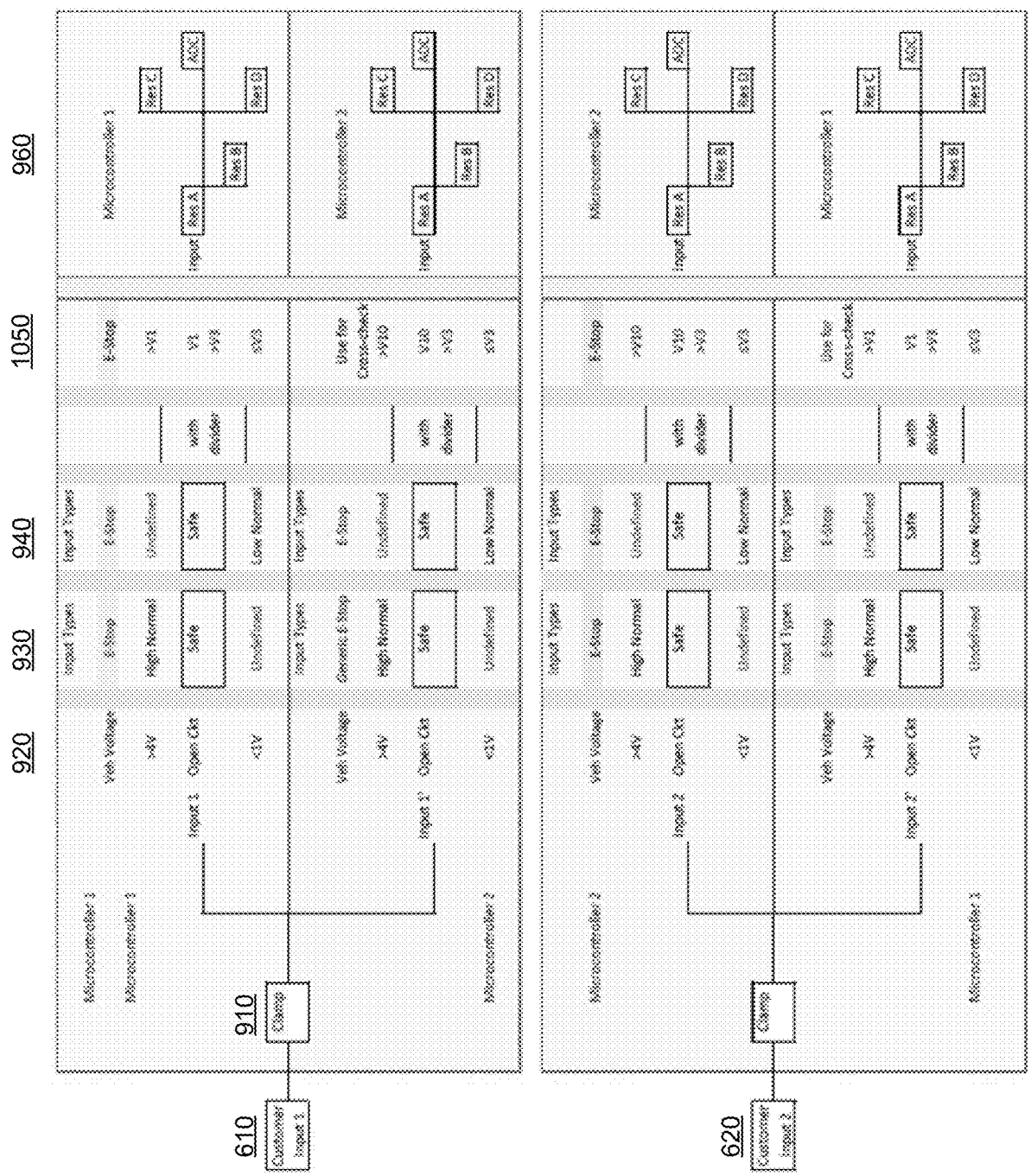
FIG. 10A illustrates one embodiment of converting analog input into a ternary state in a vehicle environment having a normal or open circuit.

Additional determination of how states, including fault states, are determined, is described in further detail with reference to FIGS. 11-12. However, by way of brief introduction, failure indicators (FIs) and non-failure indicators (NFIs) may be derived from encoded ternary values. That is, FIs and NFIs may be derived from any encoded ternary value at the first microcontroller (that is, for both input 710 and 720), and may be derived from any encoded ternary value at the second input controller (again, for both input 710 and 720). These four sets of NFIs and FIs are encoded in a manner where they have a hamming distance of at least 4 from one another, and also have a hamming distance of at least 4 from the ternary values from which they were derived. Significantly, similar to the foregoing, ensuring this hamming distance across all of the NFIs, FIs, and ternary values, across multiple inputs and multi-controllers, prevents software overwrite protection from bit-line errors. An example of FIs and NFIs and their counterpart ternary values is depicted in FIG. 12, which is described in further detail FIG. 10A illustrates one embodiment of converting analog input into a ternary state in a vehicle environment having a narrow safety range. FIG. 10 shows the same setup as FIG. 9, except for ternary state logic 930 and 940 depending on different conditions 1050. This illustrates that, in the use case of an e-stop button, a narrow range is defined for an open circuit where a safety state will be used (e.g., a circuit is designed to open when the e-stop button is pressed). In the particular use case of an e-stop button, a safe state is determined when there is an open circuit. That is, when an e-stop button is unpressed (that is, no person has attempted to shut down a machine (or many machines in a zone or in a facility), the circuit is connected, but when the e-stop button is pressed, a switch flips open. This results in, unlike FIG. 9, a known safety state where voltage corresponding to an open circuit is detected. That is, while in FIG. 9, one would not know whether or not there is an error where there is an open circuit, and would just detect an undefined state, in FIG. 10A, a middle range results in a known state that a safe state must be entered. This is the critical difference between FIGS. 9 and 10—other operations, comparisons within microcontrollers across inputs and comparisons across microcontrollers, encoded values, FIs and NFIs, and overwrite protections otherwise operate similarly.

FIG. 10B shows an illustrative table representing normal states, safety states, and fault states. FIG. 10B corresponds to FIG. 10A, in either a scenario where high=normal and low=normal. The X-axis represents a determined state by microcontroller 1, and the Y-axis represents a determined state by microcontroller 2. As depicted in FIG. 10B, shaded cells indicate a normal state, and unshaded cells indicate a non-normal state. That is, where both microcontrollers determine an unasserted or asserted state (which in this case are next to one another), a normal state is determined. In all other scenarios, either a safe state is determined, or a fault state is determined, either of which result in the same outcome—that is, a safety state is entered.

Figure 11:
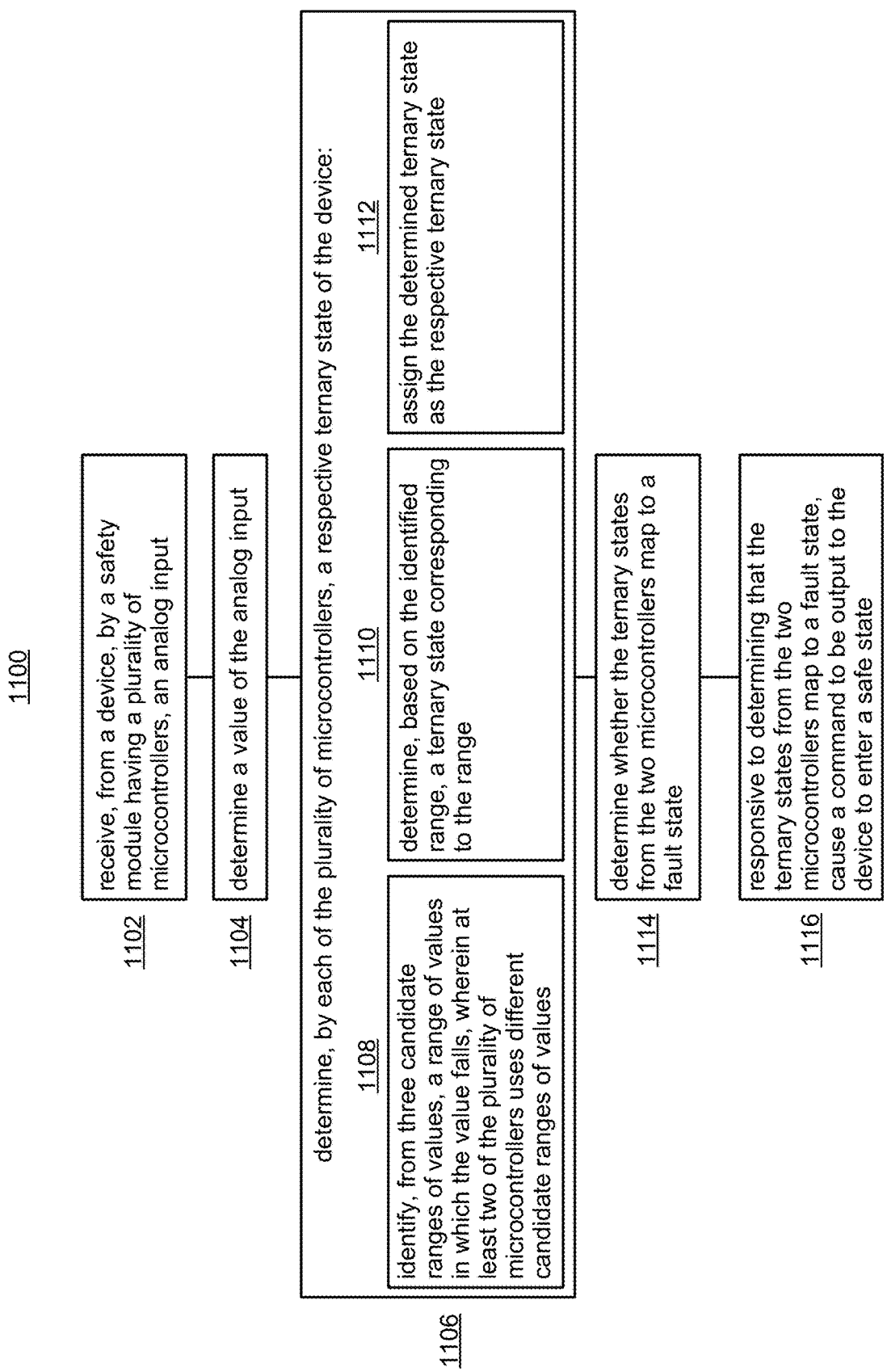
FIG. 11 illustrates an exemplary process of an embodiment for identifying a fault state based on ternary state determinations from multiple microcontrollers of a safety module, in accordance with an embodiment.

FIG. 11 illustrates an exemplary process of an embodiment for identifying a fault state based on ternary state determinations from multiple microcontrollers of a safety module, in accordance with an embodiment. Process 1100 begins with a safety module having a plurality of microcontrollers (e.g., safety module 110, having microcontrollers 211 and 212) receiving 1102 from a device (e.g., a machine, based on a sensor input such as input from an e-stop button) an analog input (e.g., input 710 and/or 720). The safety module (e.g., using application processor 213) determines 1104 a value of the analog input (e.g., either with, or without, clamping performed using clamp 910). For example, the value may be a determined voltage value, as depicted in FIGS. 9-10.

The safety module determines 1106, by each of the microcontrollers, a respective ternary state of the device (e.g., from candidate ternary states 810, 820, and 830). To perform this determination, each microcontroller identifies, from three candidate ranges of values, a range of values in which the value falls. In an embodiment, the microcontrollers may use different ranges of values (e.g., shown in 950, the voltage ranges may be different across the two different microcontrollers). The different ranges of values may provide diversity further ensuring compliance with functional safety standards. Each microcontroller determines 1110, based on the identified range, a ternary state corresponding to the range (e.g., either asserted, unasserted, or undefined, or more specific corresponding pre-programmed logic), and assigns 1112 the determined ternary state as the respective ternary state for that microcontroller.

The safety module (e.g., using application processor 213) determines whether the ternary states from the two microcontrollers map to a fault state. Exemplary indicia of fault states include determining that the ternary states from the different microcontrollers do not agree. A fault state may also be determined where one or both of the microcontrollers determine an undefined state (that is, an error is assumed where the state is undefined to ensure that an undetectable error is not missed; shown further with respect to FIGS. 9B and 10B). Responsive to determining that they do map to a fault state, the safety controller 1116 (e.g., using the application processor) cause a command to be output to the device to enter a safety state.

NFIs and FIs may further be used as discussed above with reference to FIG. 9A and below with reference to FIG. 12 to determine software overwrite and bit-line errors, which would, where detected, also result in a fault state. Ternary state value pairs (that is, values from the two microcontrollers) are encoded to have a hamming distance of greater than or equal to 4 from one another in any of various possible scenarios. In one scenario, digital values (that is, the determined ternary values) are compared to encoded versions analog values, where a hamming distance of at least 4 must be maintained. Like digital/ternary values, analog values may be translated to encoded values depending on their size based on a pre-defined encoding scheme. In such a scenario, a hamming distance of 4 is ensured in any of the following circumstances: (1) an asserted digital value compared to an asserted analog value; (2) a non-asserted digital value as compared to a non-asserted analog value; (3) an undefined digital value as compared to an undefined analog value; (4) an asserted digital value as compared to a non-asserted analog value; (5) an asserted digital value as compared to an undefined analog value; (6) a non-asserted digital value as compared to an asserted analog value; (7) a non-asserted digital value as compared to an undefined analog value; (8) an undefined analog value as compared to a non-asserted digital value; and (9) an undefined analog value as compared to an asserted digital value. Wherever these comparisons are made, hamming distances of 4 must be observed, otherwise a bit-line error has occurred and a fault is detected. Thus, safety module 210 may perform any or all of these comparisons, and may assign a fault state where a hamming distance of 4 is not achieved as a result.

In another scenario, digital values are compared to one another across the two microcontrollers, and a hamming distance of 4 of encoded values is ensured in any of the following circumstances: (1) asserted ternary values are determined in both microcontrollers; (2) non-asserted values are determined in both microcontrollers; (3) undefined ternary values are determined in both microcontrollers; (4) an asserted ternary value in one microcontroller is determined, where a non-asserted ternary value is determined in the other; and (5) an asserted ternary value in one microcontroller is determined, where an undefined ternary value is determined in the other. These scenarios can be scaled to up to 4 digital inputs that are simultaneously processed, rather than just the two depicted in FIGS. 9-10. Wherever these comparisons are made, hamming distances of 4 must be observed, otherwise a bit-line error has occurred and a fault is detected. Thus, safety module 210 may perform any or all of these comparisons, and may assign a fault state where a hamming distance of 4 is not achieved as a result.

In an embodiment, as an additional line of defense to ensure that functional safety requirements are met in an even more robust manner a fault indicator is generated that corresponds to the fault state (or lack thereof, reflected by a "no fault indicator"). The fault indicator may be generated based on the encoded values of the states from the two different microcontrollers. The fault indicator indicates whether there is a fault, or no fault, and the no fault indicator indicates the reverse. The fault state is assigned based on a pre-encoded value, where all possible pre-encoded values have a hamming distance of at least 4 from one another, thus enabling another layer where bit-line errors can be determined. That is, when fault indicators are transmitted, and a bit-line error occurs due to noise in the transmission, then the received fault indicator would not match an encoded value, and fault would be determined in the fault indicator itself, thus establishing an error state even if the machine was not determined to be in a fault state. This would ensure that a machine could enter a functional safety state while further investigation is taken to ensure that no undetectable error had occurred.

FIG. 12 illustrates one embodiment of encoded safety messages and fault indicators derived therefrom. FIG. 12 depicts various encodings of analog and digital input values, fault indicators ("FI"), and no fault indicators ("NFI") that ensure compliance with the above-described scheme of ensuring hamming distances of at least 4 are achieved, thus ensuring bit-line errors can be detected regardless of the type of memory used (e.g., RAM, flash memory, etc.). As shown in FIG. 12, MA refers to a first microcontroller, and MB refers to a second microcontroller. FIG. 12 is depicted with reference to a single input (e.g., input 720 as "Inp 2"), but this is merely exemplary, and equally applies to any input described herein.

The upper byte shown in the FIs and NFIs of FIG. 12 may improve diversity in values, and is optional. If the upper byte is removed, then the hamming distance becomes 8, rather than 4, between all possible values. Critically, the hamming distance of the lower byte values of the FIs and NFIs shown in FIG. 12 all have a hamming distance of at least 4 from one another. That is, whether FIs and NFIs are compared across FIs and NFIs for different inputs within a same microcontroller, across FIs and NFIs of a second microcontroller of a safety module or controller, or compared to encoded ternary values, a hamming distance of 4 is maintained.

Figure 13:
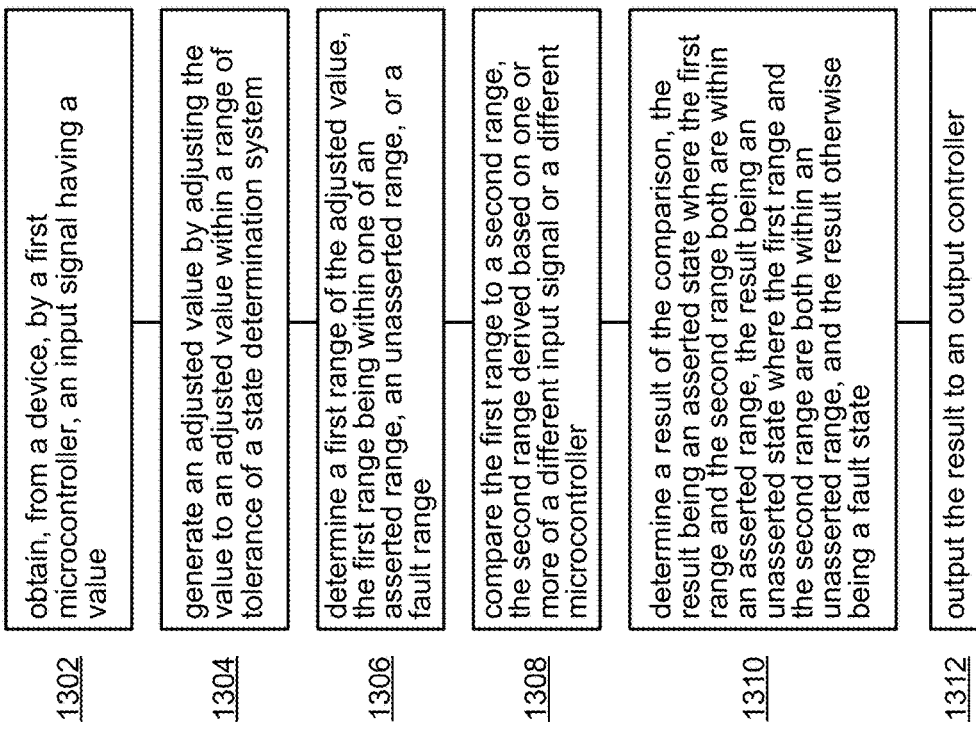
FIG. 13 illustrates an exemplary process of an embodiment for a hardware implementation of fault state identification.

FIG. 13 illustrates an exemplary process of an embodiment for a hardware implementation of fault state identification. Process 1300 begins with a first microcontroller (e.g., microcontroller 211, of safety module 210) receiving 1302, from a device, an input signal (e.g., input 710, which may be an input from an e-stop sensor) having a value (e.g., a voltage). The safety module may generate 1304 an adjusted value by adjusting the value to an adjusted value within a range of tolerance of a state determination system (e.g., using clamp 910). The safety module determines 1306 a first range of the adjusted value, the first range being within one of an asserted range, an unasserted range, or a fault range (e.g., by performing a ternary value conversion from the analog value of the input, as described above; the fault range may correspond to a safety state of an e-stop sensor). Each range may have encoded values, as described above, that have a hamming distance of at least 4 from one another, enabling detection of bit-line errors.

The safety module compares 1308 the first range to a second range (e.g., each microcontroller separately performs the comparison), the second range derived based on one or more of a different input signal or a different microcontroller. In an embodiment, the second range is derived based on a second microcontroller, where each range of the second microcontroller also has encoded values having a hamming distance of 4 from one another, and from the encoded values of the first range, the encoded values being different (e.g., based on the different voltage parameters used in the second microcontroller, shown in 950). The comparison enables the safety module to observe for bit-line errors, in that should a bit-line error have occurred, the encoded values would not be observed, as a hamming distance of 4 could not have been maintained.

The safety module may perform a comparison by comparing the first range to a third range derived based on the different input signal (e.g., input 720). The different input signal, when processed, may result in a selection of ranges having different encoded values (e.g., encoding may depend on where within a range an analog value falls). Where comparisons are performed across inputs, further diversity is achieved, offering further opportunity for the safety module to detect bit-line errors where encoded values are not within a hamming distance of 4 from one another.

The safety module may perform a comparison by comparing the first range to a fourth range derived from a different application across the first microcontroller. That is, different applications may be run by a given microcontroller, each application corresponding to a different function. As an example, where functional safety diagnostics are within a microcontroller having an ALU, RAM, Flash, clock, and internal power hardware self-check, rather than use 2 different microcontrollers as described herein, such a high capability microcontroller may perform diagnostics and checks described here without using a second microcontroller, by instead using 2 different applications having separate software with different values. In such a scenario, transmitting ADC pairs implementation may change (e.g., 1's complements are no longer needed as described above). The two applications function similarly to the function described with respect to a two microcontroller implementation described throughout. Encodings for each range may depend on the application corresponding to what is encoded. Here, again, hamming distances of at least 4 are achieved when encoding values of the fourth range, both from one another and from the range of the initial application, again enabling detection of bit-line errors. Hardware architecture may be separated into different ADC banks as compared to using two microcontrollers that may share a same ADC bank.

The safety module determines 1310 a result of the comparison(s), the result being an asserted state where the first range and the second range both are within an asserted range, the result being an unasserted state where the first range and the second range are both within an unasserted range, and the result otherwise being a fault state, and outputs 1312 the result to an output controller. When determining the result of the comparisons, any or all of the above-mentioned comparisons across inputs, ranges, and applications, and possibly across the microcontrollers themselves, may be performed in order to provide an extremely robust tool for detecting bit-line errors, where any detected bit-line error results in a fault state being detected.

As mentioned with reference to FIG. 11, fault indicators (and no-fault indicators) may be generated based on any of the comparisons across encoded values. The fault indicators themselves are encoded to values having a hamming distance of at least 4 from one another and should fall within pre-encoded values. If the safety module determines that they do not fall within the pre-encoded values, then a fault is detected, and a fault state is determined even where the result indicates a state other than a fault state, as a bit overwrite is detected.

Figure 14:
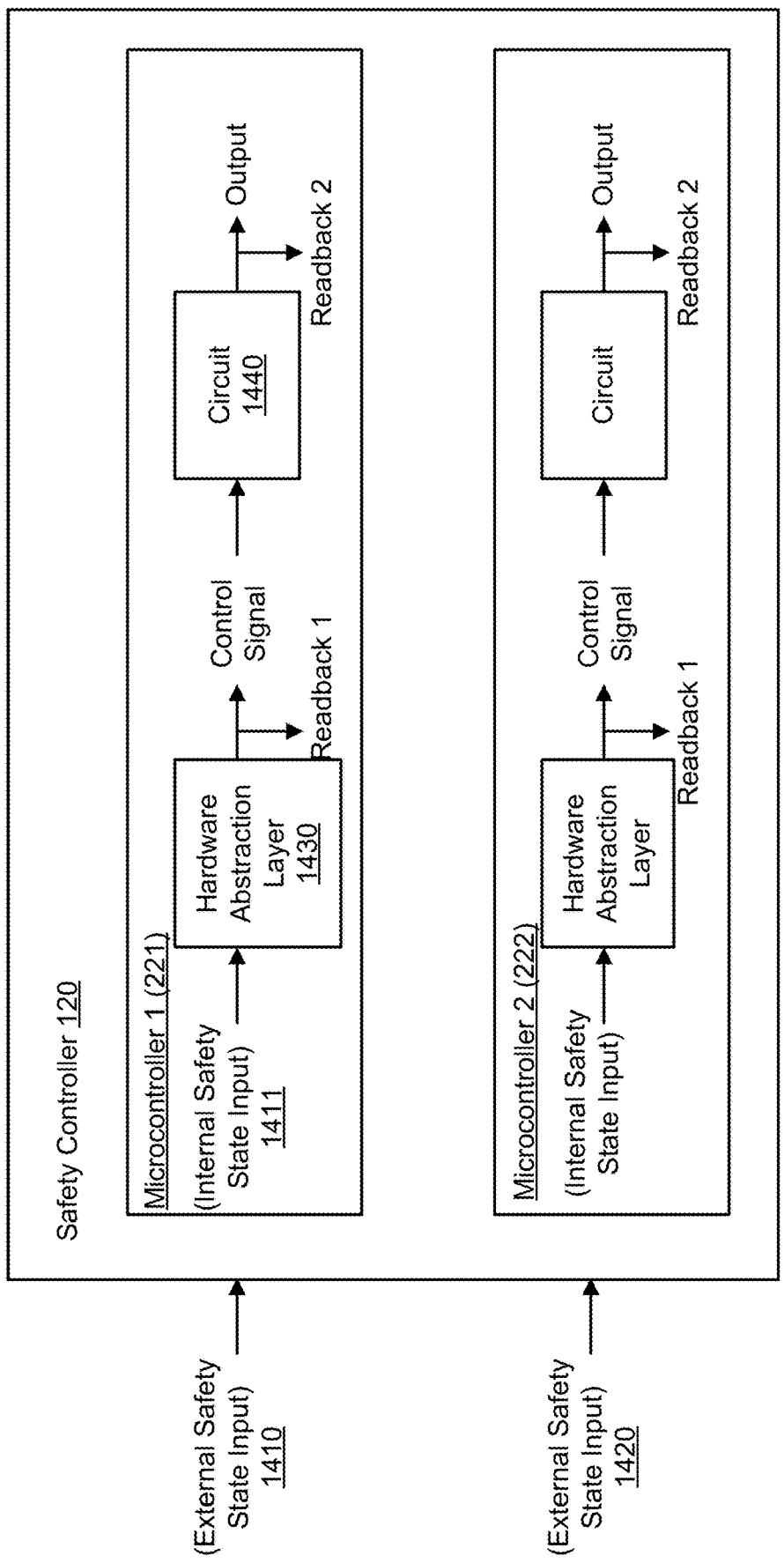
FIG. 14 illustrates one embodiment of an output controller and internal mechanisms thereof of ensuring functional safety compliance.

FIG. 14 illustrates one embodiment of an output controller and internal mechanisms thereof of ensuring functional safety compliance. As depicted in FIG. 14, safety controller 120 receives safety state inputs, and processes them using microcontrollers 221, resulting in outputs. The outputs are used to transmit commands to machines (e.g., safety modules, or other lower-level controllers) to perform a function (e.g., enter a safety mode, by, e.g., disabling a fuel line or power source). While FIG. 14 is depicted in the context of safety controller 120, any higher-order controller may process safety state inputs in a similar manner, such as a zone controller, facility controller, and so on.

The term safety state input, as used herein, may refer to a determination of whether a downstream safety module 210 is, or is not, in a fault state (e.g., the result determined in FIG. 13). In an embodiment, the safety state input may be the ternary state determined for a given downstream safety module 210 based on its inputs (e.g., asserted, unasserted, undefined). Such inputs are external safety state inputs 1410 and 1420 (further inputs, though not depicted, may also be received by safety controller 120). Safety inputs may also be internal, as depicted using internal safety state input 1411, which reflects safety state information from safety controller 120 itself.

Regardless of whether the safety state information is internal or external, each microcontroller transmits the safety state information to hardware abstraction layer (HAL) 1430, which converts the safety state information (which is information encoded in software), and converts it into a hardware control signal (e.g., having a value of enabled, disabled, or undefined). HAL 1430 converts the software information into encoded values that are encoded in a manner that they have a hamming distance of 4 from each other and from encodings performed by each other microcontroller of the safety controller 120. At this juncture, readback 1 may be compared by microcontroller 221 and microcontroller 222 against internal safety state input 1411 (or external safety input 1410). That is, after conversion by HAL, safety controller 120 may compare readback information from each microcontroller to determine whether unexpected encodings are detected, and therefore whether an error has occurred. Where a mismatch between the input (1410/1411) and readback 1 is detected, NFI/FI indicators are encoded in a similar manner described in the foregoing. Further details about how conversion is performed is described below with reference to FIG. 15.

Each microcontroller then transmits the control signal to a circuit 1440 for processing. The processing may include generating a command for the downstream device to perform an action (e.g., continue normal processing; enter a safety mode; etc.). The commands are also encoded in a similar manner where a hamming distance of 4 is ensured between possible commands issuable by a given microcontroller, and commands issued by the other microcontroller, such that bit-line errors are detectable.

Each microcontroller's output readback (that is, the Readback 2 as generated from both microcontroller 221 and microcontroller 222) is compared to determine whether the outputs match. Readback 2 is also compared to the input to perform a match determination (similar to operations described above with respect to Readback 1). Yet further, Readback 2 is compared to Readback 1. Should the outputs match, and should no bit-line error have been detected during processing of the output information by the safety controller 120, then safety controller 120 may transmit the output command to any affected downstream device(s) to perform a corresponding action. Where any bit-line error was detected, the output command will default to having affected downstream device(s) enter a safety mode, and NFI/FI indicators are encoded.

Output commands are either high or low, and thus readbacks will include high or low values, but will not have undefined values, thus resulting in NFIs and FIs also not having undefined values, per se. However, translating ternary inputs into high/low values for output commands is possible, because the end result of detecting a fault is the same as detecting a safe state—that is, regardless of whether a safe state is detected, or whether something undefined is detected (that is, one of the aforementioned comparisons does not yield a match), the system reverts to a safe state. Thus, high may map to a normal state, and low may map to both a safe state and to an undefined state.

Figure 15:
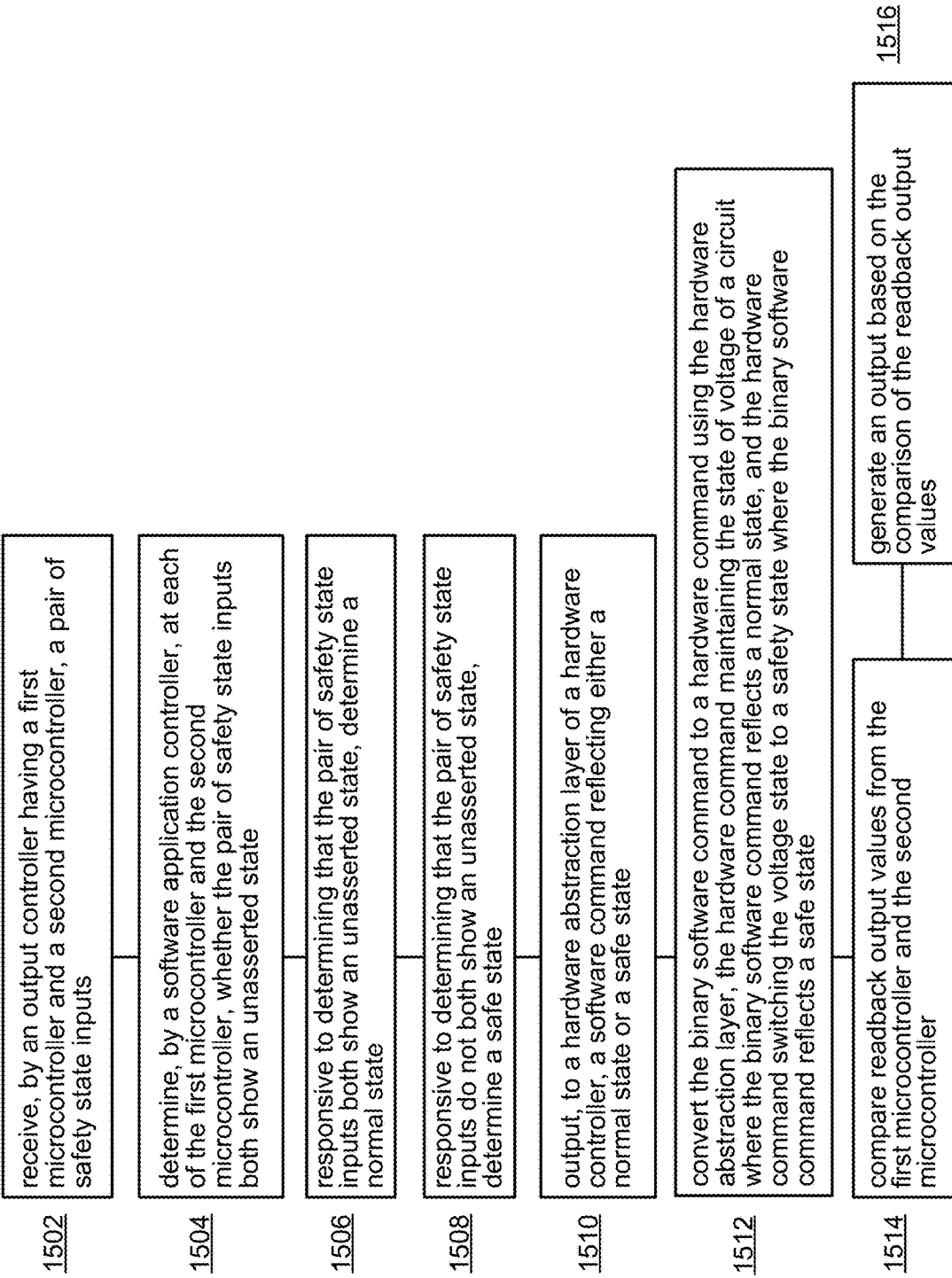
FIG. 15 illustrates an exemplary process for determining fault state using an output controller, in accordance with an embodiment.

FIG. 15 illustrates an exemplary process for determining fault state using an output controller, in accordance with an embodiment. Process 1500 begins with an output controller having a first microcontroller and a second controller receiving 1502 a pair of safety state inputs (e.g., safety controller 120 receiving inputs 1410 and 1420). The output controller then converts the safety state inputs, which are ternary in nature, to for processing through hardware. To this end, at each of the first microcontroller and the second microcontroller, the output controller determines 1504, by a software application controller, whether the pair of safety state inputs both show an unasserted state. Responsive to determining that the pair of safety state inputs both show an unasserted state, the software application controller determines 1506 a normal state. Responsive to determining that the pair of safety state inputs do not both show an unasserted state, the software application controller determines 1508 a safe state. That is, wherever both safety state inputs do not together show an unasserted state, then either a safe state has been explicitly been commanded from the safety state input signals, or an error may be present, thus requiring reversion to the safe state.

The output controller outputs 1510, to a hardware abstraction layer of a hardware controller (e.g., HAL 1430), a software command reflecting either a normal state or a safe state, and converts 1512 the software command to a hardware command using the hardware abstraction layer, the hardware command maintaining the state of voltage of a circuit where the binary software command reflects a normal state, and the hardware command switching the voltage state to a safety state where the binary software command reflects a safe state (e.g., as commanded using the control signal output by HAL 1430).

To ensure functional safety compliance, the output controller compares readback output values from the first microcontroller and the second microcontroller (comparisons are made between Readback 1 and the input, Readback 2 and the input, Readback 1 and Readback 2, and across both microcontrollers to ensure both Readback 2s match, as described above), and generates an output based on the comparison of the readback output values (e.g., performing an extra check for bit-line errors, and commanding a safety state regardless of whether the safety state or the normal state was detected where a bit-line error is observed). For example, where readback output values from the first microcontroller include a normal state, wherein readback output values from the second microcontroller include a safety state, the output is associated with a command to enter a safety state. Further comparisons may be performed, such as comparing values associated with the determination made by the software controller for the first microcontroller with the readback output value from the first microcontroller, and additionally determining whether the output is to be associated with a command to enter the safety state based on whether bit-line errors are detected from this additional comparison. Yet further comparisons may be performed by comparing values as associated with the state determined by each microcontroller with one another, and monitoring for bit-line errors based on this comparison. Fault indicator values from any of these encoded values may also be used to observe bit-line errors in any manner discussed in the foregoing, in that any of the above-mentioned comparisons are expected to result in result values each having a hamming distance of 4 from one another, where an overwrite error is detected where a result has a value other than one expected in the result values.

Figure 16:
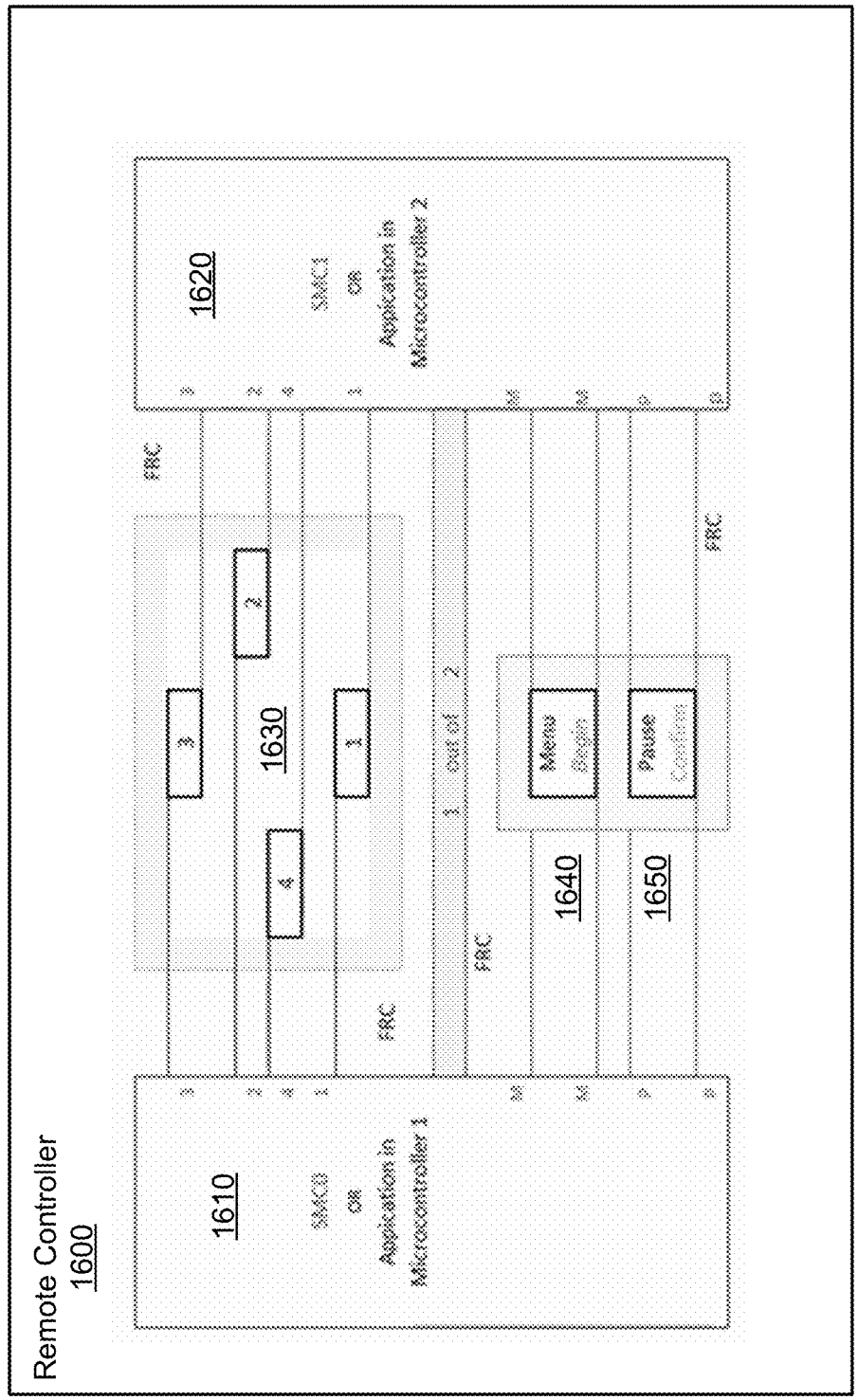
FIG. 16 illustrates one embodiment of a remote controller for interacting with a machine while using functional safety.

FIG. 16 illustrates one embodiment of a remote controller for interacting with a machine while ensuring functional safety compliance. As depicted in FIG. 16, remote controller 1600 includes microcontrollers 1610 and 1620. Various actuators are operably coupled to both of microcontrollers 1610 and 1620. This includes safety actuators, such as menu actuator 1640 and pause actuator 1650, and secondary actuators 1630. The term safety actuator, as used herein, may refer to an actuator whose operation is associated with functional safety, and thus whose communications are subject to compliance with functional safety requirements. The safety actuators are digital input controls that activate and deactivate various modes (semi-autonomous; autonomous). Menu actuator 1640 may be used in conjunction with varied numeric value patterns (e.g., confirmation numbers input using secondary actuators to input and/or confirm activation). Pause actuator 1650 (and menu actuator 1640) may be used to deactivate a mode (e.g., semi-autonomous and autonomous transitioning back to normal or functional mode). The term secondary actuators, as used herein, may refer to actuators that communicate with one or more of the microcontrollers 1610 and 1620, but whose communications are subject to reduced level functional safety requirements. The secondary actuators may be actuators (e.g., alphanumeric keys or similar) for inputting commands, such as commands to scroll through a menu, make selections, and so on. While not depicted, remote controller 1600 may include an application processor that accepts commands from the actuators. A display may be included on remote controller 1600, the display reflecting status based on selection of a given actuator, where the display may be driven by the application processor.

Remote controller 1600 may be used to interact with one or more machines of facility 100, including safety modules thereof, safety controllers, zone controllers, and so on. Remote controller 1600 may transmit any form of communication to the machines, such as functional safety information, control information, and other information requiring best-effort communications. In an embodiment, menu actuator 1640 may be selected, which opens a menu display on remote controller 1600. Secondary actuators 1630 may be used to navigate through the menu and select commands. Where a command is selected that relates to functional safety, the commands cause the generation of a safety message, using both of microcontrollers 1610 and 1620, where agreement is reached and bit-line errors are checked for prior to transmission of the command. When a functional safety command is validated, the machine enters a functional safety mode, and further communications from remote controller 1600 are subject to functional safety safeguards. That is, commands to perform operations within that functional safety mode are verified by both remote controllers and are checked for bit-line errors, and the machine is commanded to enter a safety state (e.g., cease function) where commanded to do so, or where fault states or errors are detected, in the manner described in the foregoing.

Pause button 1650 may be used to command a machine to pause an activity. In an embodiment, pause button 1650 may be regarded as a fail safe that is intended to deactivate an activity that is subject to functional safety requirements. In an embodiment where the pause actuator is pressed where a user is mid-way toward activating a mode subject to a functional safety requirement (e.g., before confirming entry into that mode), activation is presented. In an embodiment where the pause actuator is pressed where such a mode is already activated, the mode is deactivated. Where that activity is an activity subject to functional safety requirements, communications from pause actuator 1650 are also subject to functional safety requirements, and communications are processed in the same manner described with respect to menu actuator 1640. In an embodiment, selection of the pause button may be detected while a machine is operating in a safety mode, which may result in the remote controller transmitting a command to the machine to enter a safety state. An additional selection of the menu actuator may cause the same result (e.g., entering a safety state, given that the press may be accidental in a user attempting to pause the machine). Further details relating to the operation of remote controller 1600 are described below with respect to FIG. 17.

FIG. 17 illustrates one embodiment of an exemplary process for operating a remote controller to initiate functional safety activities, in accordance with an embodiment. Process 1700 begins with a device (e.g., remote controller 1600) operating in a normal mode (e.g., not a functional safety mode), receiving 1702 a request to switch to a functional safety mode (e.g., semi-autonomous or autonomous modes). The request includes a selection of a safety actuator (e.g., menu actuator 1640) and one or more of a plurality of secondary actuators (e.g., pause actuator 1650), the safety actuator operably coupled to a first microcontroller (e.g., microcontroller 1610), a second microcontroller (e.g., microcontroller 1620), and an application processor of the device, the plurality of secondary actuators each operably coupled to the application processor.

As a safeguard, prior to proceeding to 1704, the application processor may require entry of a predetermined sequence of secondary actuators (e.g., a predetermined numeric entry of some number of keys). As a secondary safeguard, a confirmation sequence of secondary actuators may be required, where the confirmation sequence may require re-entry of a same sequence, or additional entry of a different sequence, of secondary actuators prior to proceeding to 1704.

Responsive to receiving the request, the device transmits 1704 a first safety message from the safety actuator to the first microcontroller and a second safety message from the safety actuator to the second microcontroller (e.g., for redundant and/or diverse processing (e.g., diversity is achieved by using different values at each microcontroller) of the safety message in any manner consistent with the foregoing). The device validates 1706 the safety message at the first microcontroller and the second microcontroller, the validation resulting in first validation values from the first microcontroller and second validation values from the second microcontroller (e.g., encoded values selected from candidate values each having a hamming distance of at least 4 from one another, consistent with the foregoing). Validation may be performed directly on encoded values, and may alternatively or additionally be performed on fault indicators and/or no-fault indicators as described in the foregoing.

The device validates 1708 the first validation values against the second validation values (e.g., ensuring that the results from the two microcontrollers match, and that the encoded values are expected, as discussed above). Responsive to successfully validating the safety message at the first microcontroller and the second microcontroller, and successfully validating the first validation values against the second validation values, the device commands 1710 a transition from the normal mode to the functional safety mode (e.g., by transmitting a command to a machine to switch modes). In an embodiment, where a functional safety mode is activated and a press of a menu or pause actuator is detected, the system may responsively transition back to a normal mode

ADDITIONAL CONFIGURATION CONSIDERATIONS

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or of processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information, and may refer transfer from non-volatile to volatile memory and the inverse (e.g., to safeguard against scenarios where bit and multibit transient failures have a higher likelihood of transient failure, where failure occurs and recovers but the other memory structures are left with other coupled physical structure relevant effects that do not recover).

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for using encoded values to ensure functional safety compliance across a variety of facets through the disclosed principles herein.

Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method comprising:
receiving, by a first application processor from a first microcontroller of a safety module, a first set of safety state information and a first set of bytes corresponding to a first identifier of the first microcontroller;
receiving, by the first application processor from a second microcontroller of the safety module, a second set of safety state information and a second set of bytes corresponding to a second identifier of the second microcontroller;
generating, by the first application processor, a safety message comprising the first set of safety state information, the second set of safety state information, the first set of bytes, and the second set of bytes;
transmitting, by the first application processor, the safety message to a second application processor of a safety controller;
extracting, by the second application processor, the first set of bytes and the second set of bytes from the safety message;
by a third microcontroller of the safety controller:
accessing a first encoded value corresponding to the first identifier of the first microcontroller; and
verifying the first safety state information in response to detecting a match between the first set of bytes and the first encoded value; and
by a fourth microcontroller of the safety controller:
accessing a second encoded value corresponding to the second identifier of the second microcontroller;
generating a command that causes a device to transition to a safety mode in response to detecting a difference between the second set of bytes and the second encoded value; and
transmitting the command to the device.

2. The method of claim 1, wherein generating the safety message comprises generating the safety message comprising:
the first set of bytes corresponding to the first identifier, in a set of unique identifiers, uniquely identifying the first microcontroller; and
the second set of bytes corresponding to the second identifier, in the set of unique identifiers, uniquely identifying the second microcontroller.

3. The method of claim 1, wherein generating the safety message comprises generating the safety message comprising:
the first set of bytes comprising two bytes corresponding to the first identifier exhibiting a length of one word; and
the first set of bytes comprising two bytes corresponding to the second identifier exhibiting a length of one word.

4. The method of claim 3, wherein generating the safety message comprises generating the safety message comprising the first set of bytes corresponding to the first identifier and the second set of bytes corresponding to the second identifier, the second identifier exhibiting a hamming distance greater than or equal to four from the first identifier.

5. The method of claim 1, further comprising:
loading the first set of bytes and the first encoded value into a memory device; and
detecting the match between the first set of bytes and the first encoded value by the third microcontroller comparing the first set of bytes and the first encoded value loaded into the memory device.

6. The method of claim 1, further comprising:
loading the second set of bytes and the second encoded value into a memory device; and
detecting the difference between the second set of bytes and the second encoded value by the fourth microcontroller comparing the second set of bytes and the second encoded value loaded into the memory device.

7. The method of claim 1, wherein verifying the first safety state information comprises:
detecting absence of a bit-line error associated with the first set of bytes in response to detecting the match between the first set of bytes and the first encoded value; and
verifying the first safety state information in response to absence of the bit-line error associated with the first set of bytes.

8. The method of claim 1, wherein generating the command comprises:
detecting a bit-line error associated with the second set of bytes in response to detecting the difference between the second set of bytes and the second encoded value; and
generating the command that causes the device to transition to the safety mode in response to detecting the bit-line error associated with the second set of bytes.

9. The method of claim 1, wherein accessing the first encoded value comprises accessing the first encoded value comprising:
a first set of bits selected from an even hamming set; and
a second set of bits selected from an odd hamming set.

10. The method of claim 9, wherein accessing the first encoded value comprises accessing the first encoded value comprising:
the first set of bits selected from the even hamming set and corresponding to "0011"; and
the second set of bits selected from the odd hamming set and corresponding to "0100".

11. The method of claim 1, wherein accessing the second encoded value comprises accessing the second encoded value comprising:
a first set of bits selected from an even hamming set; and
a second set of bits selected from the even hamming set.

12. The method of claim 1, wherein receiving the second set of bytes comprises receiving the second set of bytes comprising:
a first set of bits selected from an odd hamming set; and
a second set of bits selected from the odd hamming set.

13. The method of claim 12, wherein receiving the second set of bytes comprises receiving the second set of bytes comprising the first set of bits and the second set of bits, the second set of bits exhibiting a minimum hamming distance of two from the first set of bits.

14. The method of claim 1, wherein generating the safety message comprises generating the safety message comprising:
the first set of safety state information;
the second set of safety state information;
the first set of bytes corresponding to the first identifier of the first microcontroller; and the second set of bytes corresponding to the second identifier of the second microcontroller, the second set of bytes corresponding to a ones complement of the first set of bytes.

15. The method of claim 1, wherein generating the command comprises:
   generating a word based on the second set of bytes;
   detecting the difference between the word and the second encoded value; and
   generating the command that causes the device to transition to the safety mode in response to detecting the difference between the word and the second encoded value.

16. A method comprising:
   by a first application processor of a safety module:
      receiving, from a first microcontroller of the safety module, a first set of safety state information and a first set of bytes corresponding to a first identifier of the first microcontroller;
      receiving, from a second microcontroller of the safety module, a second set of safety state information and a second set of bytes corresponding to a second identifier of the second microcontroller;
      generating a safety message comprising the first set of safety state information, the second set of safety state information, the first set of bytes, and the second set of bytes; and
      transmitting the safety message to a safety controller; and
   by a third microcontroller of the safety controller:
      accessing a first encoded value corresponding to the first identifier of the first microcontroller;
      generating a command that causes a device to transition to a safety mode in response to detecting a difference between the first set of bytes and the first encoded value; and
      transmitting the command to the device.

17. The method of claim 10, further comprising, by a fourth microcontroller of the safety controller:
   accessing a second encoded value corresponding to the second identifier of the second microcontroller; and
   verifying the second safety state information in response to detecting a match between the second set of bytes and the second encoded value.

18. The method of claim 10, wherein generating the safety message comprises generating the safety message comprising the first set of bytes corresponding to the first identifier and the second set of bytes corresponding to the second identifier, the second identifier exhibiting a minimum hamming distance from the first identifier.

19. A method comprising:
   by a first application processor of a safety module:
      receiving, from a first microcontroller of the safety module, a first set of safety state information and a first set of bytes corresponding to a first identifier of the first microcontroller;
      receiving, from a second microcontroller of the safety module, a second set of safety state information and a second set of bytes corresponding to a second identifier of the second microcontroller;
      generating a safety message comprising the first set of safety state information, the second set of safety state information, the first set of bytes, and the second set of bytes; and
      transmitting the safety message to a safety controller; and
   by a third microcontroller of the safety controller:
      accessing a first encoded value corresponding to the first identifier of the first microcontroller; and
      verifying the first safety state information in response to detecting a match between the first set of bytes and the first encoded value.

20. The method of claim 13, further comprising, by a fourth microcontroller of the safety controller:
   accessing a second encoded value corresponding to the second identifier of the second microcontroller;
   generating a command that causes a device to transition to a safety mode in response to detecting a difference between the second set of bytes and the second encoded value; and
   transmitting the command to the device.

* * * * *